(12) United States Patent
Fang et al.

(10) Patent No.: US 10,120,056 B2
(45) Date of Patent: Nov. 6, 2018

(54) METHOD AND APPARATUS OF CALIBRATING IMPEDANCE-MATCHING CURRENT SENSOR

(71) Applicant: NATIONAL CHENG KUNG UNIVERSITY, Tainan (TW)

(72) Inventors: Kuan-Yu Fang, Tainan (TW); Szu-Yu Huang, Kaohsiung (TW); Tai-Haur Kuo, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 194 days.

(21) Appl. No.: 15/193,807

(22) Filed: Jun. 27, 2016

(65) Prior Publication Data

US 2017/0371021 A1 Dec. 28, 2017

(51) Int. Cl.
*G01R 35/00* (2006.01)
*H03H 7/38* (2006.01)

(52) U.S. Cl.
CPC .............. *G01R 35/005* (2013.01); *H03H 7/38* (2013.01)

(58) Field of Classification Search
CPC ................................ G01R 35/005; H03H 7/38
USPC .......................................................... 324/601
See application file for complete search history.

(56) References Cited

U.S. PATENT DOCUMENTS

| 3,962,629 | A * | 6/1976 | Martyashin | G01R 27/00 324/649 |
| 7,741,983 | B1 * | 6/2010 | Lakshmikanthan | G01R 19/0092 341/120 |
| 2007/0057679 | A1 * | 3/2007 | Ellersick | H03H 7/0153 324/601 |
| 2008/0052028 | A1 * | 2/2008 | Pickerd | G01R 31/3191 702/109 |
| 2015/0370273 | A1 * | 12/2015 | Tai | H02M 3/156 323/280 |

\* cited by examiner

*Primary Examiner* — Jeff Natalini
(74) *Attorney, Agent, or Firm* — Rabin & Berdo, P.C.

(57) ABSTRACT

A method of calibrating an impedance-matching current sensor (IMCS) is provided. The IMCS has an equivalent sensing impedance and is connected in parallel to an object under test. The method includes steps of: using an alternating-current (AC) current source to provide a first AC current flowing through the object under test and provide a second AC current flowing through the IMCS; designing the equivalent sensing impedance to make the first AC current much greater than the second AC current; proportionally converting the second AC current into a sense voltage; and adjusting a magnitude of the sense voltage to be proportional to a magnitude of the first AC current. Accordingly, it is to significantly overcome problems of unreliability and instability of the DC-to-DC conversion system caused by temperature, aging, DC bias variation, or parasitic effect, thus maintaining correct sensed results of the current sensor in transient response optimization.

15 Claims, 18 Drawing Sheets

METHOD AND APPARATUS OF CALIBRATING IMPEDANCE-MATCHING CURRENT SENSOR

BACKGROUND

1. Technical Field

The present disclosure relates generally to a method and an apparatus of calibrating a current sensor, and more particularly to a method and an apparatus of calibrating an impedance-matching current sensor.

2. Description of Related Art

Switching buck converters are widely used as voltage regulators in battery-powered portable devices to achieve high power-conversion efficiency. FIG. 20 shows a block diagram of a conventional buck converter which includes a power stage 91 and a feedback controller 92. The synchronous topology of the buck converter includes a pair of switches $S_H$, $S_L$, an output capacitor Co, and an output inductor $L_O$. The high-side switch $S_H$ and the low-side switch $S_L$ are both electrically connected to an input voltage $V_I$, which is a direct current (DC) voltage at an input side of the buck converter. In this example, the high-side switch $S_H$ is, but not limited to, a P-type MOSFET switch and the low-side switch $S_L$ is, but not limited to, an N-type MOSFET switch.

An output inductor current $I_L$ flowing through the output inductor $L_O$ is increased when the high-side switch $S_H$ is turned on. On the contrary, the output inductor current $I_L$ is decreased when the low-side switch $S_L$ is turned on.

The output capacitor $C_O$ is electrically connected between an output side of the buck converter and a ground. In particular, the output capacitor $C_O$ is modeled with its parasitic inductance $L_{Co}$ and parasitic resistance $R_{Co}$. The output inductor $L_O$ is electrically connected between the two switches $S_H$, $S_L$ and the output capacitor $C_O$ at the output side. In particular, the output inductor $L_O$ is modeled with its parasitic resistance $R_{Lo}$.

The feedback controller 92 receives a reference voltage $V_{REF}$ and an output voltage $V_O$ of the buck converter to generate a PWM signal with an adjustable duty cycle to control the high-side switch $S_H$ and the low-side switch $S_L$ so as to regulate the output voltage $V_O$ to its target value. In a continuous-conduction mode (CCM), the duty cycle of the PWM signal is equal to the ratio of the output voltage $V_O$ to the input voltage $V_I$.

FIG. 21 shows a circuit diagram of a capacitor current sensor (CCS) 90. In order to sense an output capacitor current $I_C$ flowing through the output capacitor $C_O$ with its in-series parasitic inductance $L_{Co}$ and parasitic resistance $R_{Co}$, the CCS 90 is connected to the output capacitor $C_O$ in parallel, and proportionally replicates an equivalent impedance $Z_C$ of the output capacitor $C_O$. A sensed capacitor current signal $I_S$ with a current sensing gain $K_I$ is converted into a sensor voltage signal $V_{CCS}$ by a resistor $R_I$. Therefore, the sensor voltage signal $V_{CCS}$ as a function of time is expressed as follows:

$$V_{CCS}(t)=R_I \times I_S(t)=R_I \times K_I \times I_C(t)$$

Further, an impedance $Z_{CCS}$ of the CCS 90 is $K_I$ times of the impedance $Z_C$ of the output capacitor $C_O$. In particular, the current sensing gain $K_I$ is large enough to reduce a loading effect caused by the CCS 90 so that a current sensed by the CCS 90 is $1/K_I$ times of the output capacitor current $I_C$. With the advantages of low-loading effect and non-invasive sensing, the impedance-matching CCS 90 is widely applied for sensing a current of the output inductor and a current of the output capacitor.

The impedance-matching CCS 90 has three sensing parameters, including a sensing capacitance $C_S$, a sensing resistance $R_S$, and a sensing inductance $L_S$, which are corresponding to the output capacitance $C_O$, the parasitic resistance $R_{Co}$, and the parasitic inductance $L_{Co}$, respectively. When the impedance $Z_{CCS}$ of the CCS 90 is matched to the impedance $Z_C$ of the output capacitor $C_O$, the following relationships are satisfied:

$$C_S=C_O \times K_I, L_S=L_{Co}/K_I, \text{ and } R_S=R_{Co}/K_I.$$

According to the above-mentioned relationships, the CCS 90 may accurately sense the output capacitor current $I_C$. However, the output capacitor $C_O$ is varied due to different manufacturing processes, bias voltages, frequencies, and so on, resulting in incorrect current sensing. Therefore, the incorrect sensed results of the CCS 90 cause problems of unreliability and instability and a lack of transient response optimization.

SUMMARY

Accordingly, a method of calibrating an impedance-matching current sensor (IMCS) is provided to attempt to resolve the above-mentioned disadvantages.

The IMCS has an equivalent sensing impedance and is connected in parallel to an object under test. The method includes steps of using an alternating-current (AC) current source to provide a first AC current flowing through the object under test and to provide a second AC current flowing through the IMCS; designing the equivalent sensing impedance to make the first AC current much greater than the second AC current; proportionally converting the second AC current into a sense voltage; and adjusting a magnitude of the sense voltage to be proportional to a magnitude of the first AC current.

Accordingly, a method of calibrating an impedance-matching current sensor (IMCS) in a buck converter is provided to attempt to resolve the above-mentioned disadvantages.

The IMCS has a sensing inductance, a sensing capacitance, and a sensing resistance connected in series. The method includes steps of executing a calibration of the IMCS; operating the buck converter under an open-loop control; calibrating one of the sensing inductance and the sensing capacitance; calibrating the other of the sensing inductance and the sensing capacitance; and calibrating the sensing resistance.

Accordingly, an apparatus of calibrating an impedance-matching capacitor current sensor (IMCS) in a buck converter is provided to attempt to resolve the above-mentioned disadvantages.

The apparatus of calibrating the IMCS in the buck converter is disclosed. The IMCS has a sensing inductance, a sensing capacitance, and a sensing resistance connected in series. The apparatus includes an inductor current sensor, the IMCS, a current ripple comparator, and a controller. The inductor current sensor is configured to sense an output inductor current flowing through an output inductor of the buck converter. The IMCS is configured to sense an output capacitor current flowing through an output capacitor of the buck converter. The current ripple comparator is configured to compare a ripple of the output capacitor current with a ripple of the output inductor current to generate a comparison signal. The controller is configured to receive the comparison signal and a calibration enable signal; wherein the controller is configured to control the buck converter being operated under an open-loop operation and calibrate the sensing inductance, the sensing capacitance, and the sensing resistance according to the comparison signal and the calibration enable signal.

The IMCS effectively detects the variation of the output capacitor after calibration thereof by tuning the three sensing parameters of the IMCS. Accordingly, it is to significantly overcome problems of unreliability and instability of the DC-to-DC conversion system caused by temperature, aging, DC bias variation, or parasitic effect and to maintain correct sensed results of the IMCS in transient response optimization.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The features of the present disclosure believed to be novel are set forth with particularity in the appended claims. The present disclosure itself, however, may be best understood by reference to the following detailed description of the present disclosure, which describes an exemplary embodiment of the present disclosure, taken in conjunction with the accompanying drawings, in which:

DETAILED DESCRIPTION OF PREFERRED EMBODIMENT

Figure 1:
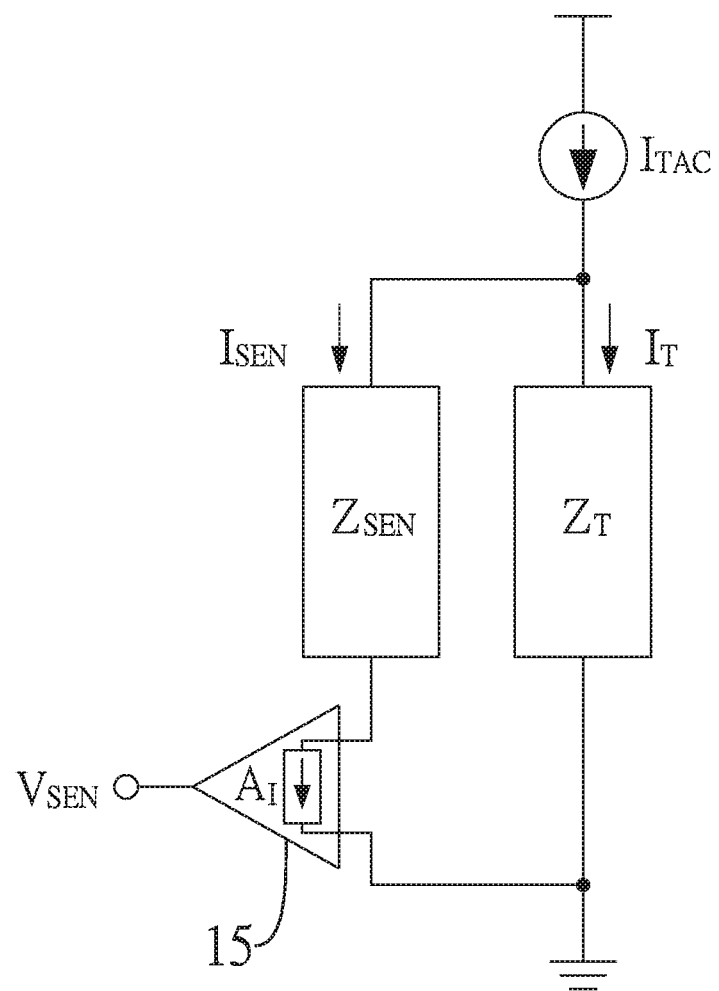
FIG. 1 is a schematic view of calibrating an impedance-matching current sensor (IMCS)

Reference will now be made to the drawing figures to describe the present disclosure in detail.

FIG. 1 shows a schematic of calibrating an impedance-matching current sensor (IMCS) of the present disclosure. The IMCS with a sense impedance $Z_{SEN}$ is connected in parallel to a device under test (DUT) and an equivalent impedance of the DUT is expressed as a target impedance $Z_T$. It is assumed that the sense impedance $Z_{SEN}$ is equal to $K_I$ times of the target impedance $Z_T$, i.e., $Z_{SEN}=K_I \times Z_T$.

In addition, an alternating-current (AC) test current $I_{TAC}$ is provided, and a part of the AC test current $I_{TAC}$, i.e., a target current $I_T$, flows through the DUT and the other part of the AC test current $I_{TAC}$, i.e., a sense current $I_{SEN}$ flows through the IMCS. Therefore, under a certain frequency $f_0$, the following relationship is satisfied:

$$Z_{SEN}(f_0)=K_I \times Z_T(f_0)$$

Correspondingly, a relationship between the target current $I_T$ and the sense current $I_{SEN}$ under the certain frequency $f_0$ is satisfied as follows:

$$I_T(f_0)=K_I \times I_{SEN}(f_0)$$

In the present disclosure, it is assumed that the $K_I$ is large enough to reduce the loading effect caused by the IMCS so that the target current $I_T$ is almost equal to the AC test current $I_{TAC}$. Therefore, the current relationship is satisfied as follows:

$$I_{TAC}(f_0)=K_I \times I_{SEN}(f_0)$$

In addition, the sense current $I_{SEN}$ is converted into a sense voltage $V_{SEN}$ by a current-to-voltage (I-to-V) converter 15 with a gain $A_I$, that is $$V_{SEN}(f_0)=A_I \times I_{SEN}(f_0)$$

If the gain $A_I$ is designed to be equal to the $K_I$, the conversion relationship is satisfied as follows:

$$V_{SEN}(f_0)=I_{TAC}(f_0)$$

Accordingly, the $Z_{SEN}(f_0)$ is needed to be an increasing adjustment until the $V_{SEN}(f_0)$ is equal to the $I_{TAC}(f_0)$ when $V_{SEN}(f_0)>I_{TAC}(f_0)$ is detected. On the contrary, the $Z_{SEN}(f_0)$ is needed to be an decreasing adjustment until the $V_{SEN}(f_0)$ is equal to the $I_{TAC}(f_0)$ when $V_{SEN}(f_0)<I_{TAC}(f_0)$ is detected. In the present disclosure, a current sensor is, but not limited to, a capacitor current sensor (CCS) 10. However, the current sensor can be further used for sensing an inductor current flowing through an inductor with its parasitic component(s). As mentioned previously, the CCS 10 is provided to sense the output capacitor current $I_C$ flowing through the output capacitor $C_O$ with its in-series parasitic inductance $L_{C_O}$ and parasitic resistance $R_{C_O}$. However, it is not limited to only this type of in-series connection of R-L-C components, where C is the output capacitor $C_O$, R is the parasitic resistance $R_{Co}$, and L is the parasitic inductance $L_{Co}$. In other words, the impedance-matching current sensor (IMCS) is used for other types of connections of R-L-C components, such as an in-parallel connection or a series-parallel connection. For convenience, the CCS 10 used to sense the output capacitor current $I_C$ flowing through the output capacitor $C_O$ with its in-series parasitic inductance $L_{Co}$ and parasitic resistance $R_{Co}$ is exemplified for further demonstration as follows.

Figure 2:
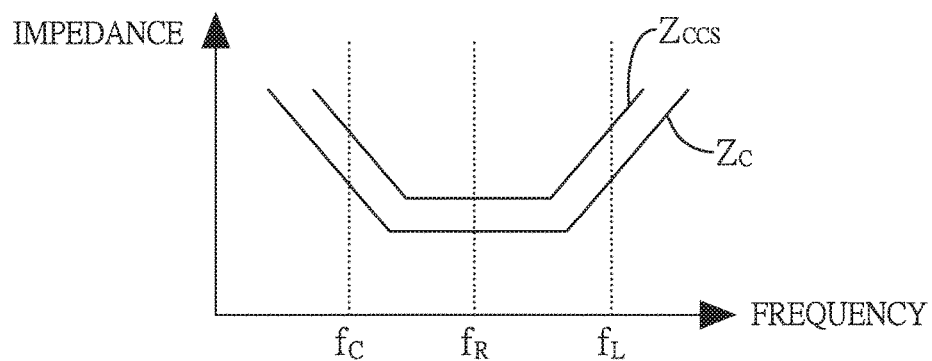
FIG. 2 is a schematic view of an impedance of an output capacitor and an impedance of a capacitor current sensor (CCS) in different switching frequencies.
Figure 3:
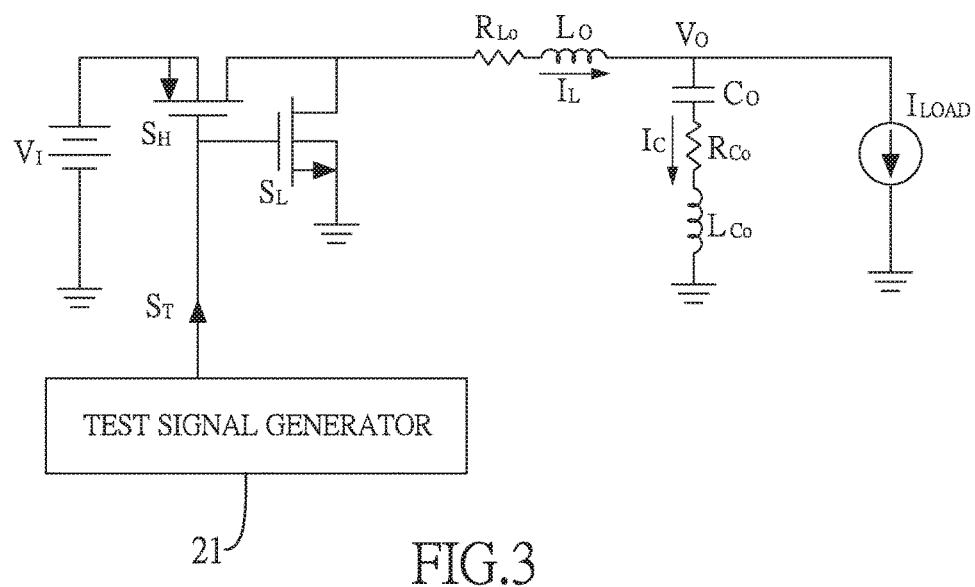
FIG. 3 is a circuit block diagram of a buck converter operated under an open-loop control.

A calibration of the CCS 10 for the in-series connection of R-L-C components in a buck converter is proposed in the present disclosure. Depending on different dominated switching frequencies, the corresponding sensing parameters $C_S$, $R_S$ and $L_S$ of the CCS 10 are calibrated. As shown in FIG. 2, an impedance $Z_C$ of the output capacitor $C_O$ and an impedance $Z_{CCS}$ of the CCS 10 in a lower frequency are dominated by the capacitive impedance, the impedance $Z_C$ of the output capacitor $C_O$ and the impedance $Z_{CCS}$ of the CCS 10 in an intermediate frequency are dominated by the resistive impedance, and the impedance $Z_C$ of the output capacitor $C_O$ and the impedance $Z_{CCS}$ of the CCS 10 in a high frequency are dominated by the inductive impedance.

FIG. 2 shows current behavior of the buck converter operated under an open-loop control, where $I_L$ is an output inductor current, $I_C$ is an output capacitor current, and $I_{LOAD}$ is a load current. Also, the output inductor current $I_L$ is equal to the sum of the load current $I_{LOAD}$ and the output capacitor current $I_C$, i.e., $I_L = I_{LOAD} + I_C$. The load current $I_{LOAD}$ is determined depending on rear-end loads. The alternating-current (AC) component of the output inductor current $I_L$ is determined according to a cross voltage of the output inductor $L_O$ and the switching frequency, and the direct-current (DC) component of the output inductor current $I_L$ is determined according to the load current $I_{LOAD}$. Therefore, the output capacitor current $I_C$ is irrelevant to the output capacitor $C_O$. In the continuous-conduction mode (CCM) of the buck converter, a ripple of the output capacitor current $\Delta V_{CCS}$ is equal to a ripple of the output inductor current $\Delta I_L$. Accordingly, the ripple of the output inductor current $\Delta I_L$ is used as a reference to compare with the ripple of the output capacitor current $\Delta V_{CCS}$ so as to judge whether the sensed results by the CCS 10 are correct or not. Note that, the information of the sensing voltage signal $V_{CCS}$ is used to express the information of the output capacitor current $I_C$ since the sensing voltage signal $V_{CCS}$ is converted from the output capacitor current $I_C$ via the resistor $R_I$ and the current sensing gain $K_I$.

As mentioned above, the output capacitor $C_O$ is modeled with its parasitic inductance $L_{Co}$ and parasitic resistance $R_{Co}$ connected in series. Therefore, a transfer function of the impedance $Z_C$ of the output capacitor Co is expressed as:

$$Z_C(s) = \frac{V_O(s)}{I_C(s)} = \frac{s^2 L_{Co} C_O + s R_{Co} C_O + 1}{s C_O}$$

Therefore, a transfer function of the CCS is expressed as:

$$G_S(s) = \frac{V_{CCS}(s)}{V_O(s)} = \frac{K_I}{Z_C(s)} = K_I \times \frac{s C_O}{s^2 L_{Co} C_O + s R_{Co} C_O + 1} = \frac{s C_S}{s^2 L_S C_S + s R_S C_S + 1},$$

where $K_I$ is the current sensing gain.

A test signal generator 21 generates a test signal $S_T$, such as a PWM signal, with an adjustable switching frequency $f_{Sw}$. The switching frequency $f_{Sw}$ is adjusted to an inductance-calibrating frequency $f_L$, a capacitance-calibrating frequency $f_C$, or a resistance-calibrating frequency $f_R$. In particular, the inductance-calibrating frequency $f_L$ is greater than the resistance-calibrating frequency $f_R$ and the resistance-calibrating frequency $f_R$ is greater than the capacitance-calibrating frequency $f_C$.

As mentioned above, the impedance $Z_C$ of the output capacitor $C_O$ is the capacitive impedance in the lower frequency, such as the capacitance-calibrating frequency $f_C$. As the frequency rises, the effect of the parasitic resistance is higher, and thus the impedance $Z_C$ of the output capacitor $C_O$ is the resistive impedance in the intermediate frequency, such as the resistance-calibrating frequency $f_R$. When the frequency further rises, the effect of the parasitic inductance is higher, and thus the impedance $Z_C$ of the output capacitor $C_O$ is the inductive impedance in the higher frequency, such as the inductance-calibrating frequency $f_L$.

Figure 4:
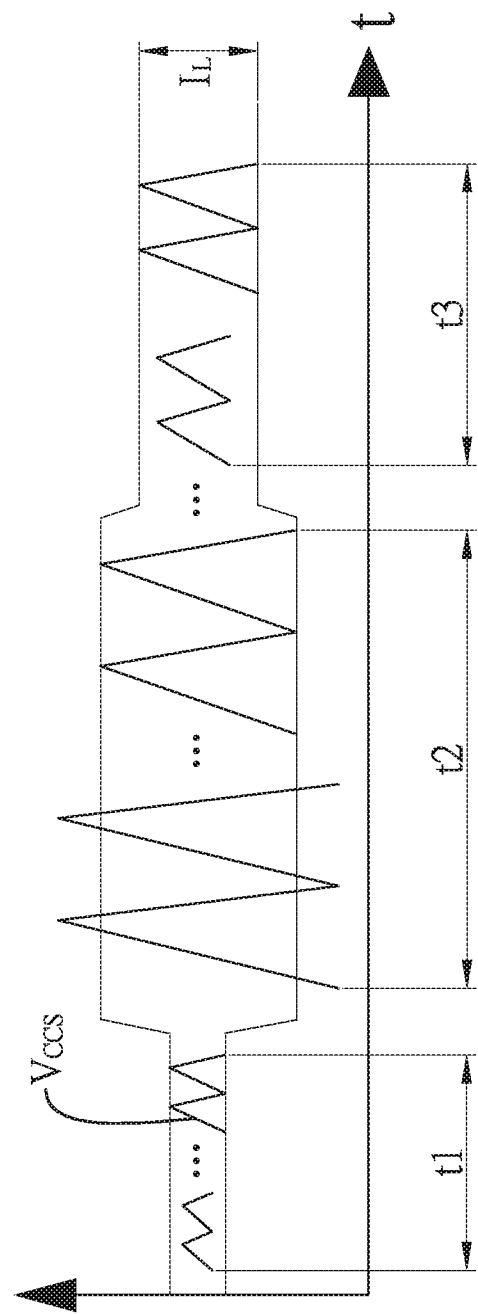
FIG. 4 is a schematic view of the calibration of the CCS under different switching frequencies.
Figure 5A:
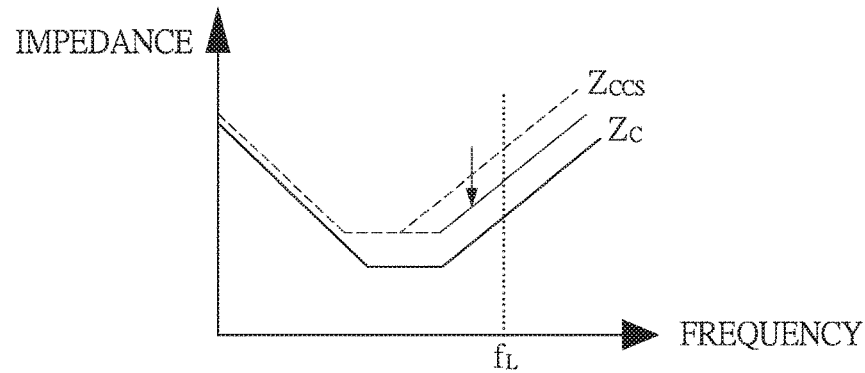
FIG. 5A is a schematic view of calibrating a sensing inductance.

FIG. 4 and FIG. 5A to FIG. 5C show the calibration of the CCS 10 under different switching frequencies. FIG. 5A and a time period t1 in FIG. 4 show that the sensing inductance $L_S$ of the CCS 10 is calibrated from a dotted line to a solid line. In a high frequency, the impedance $Z_{CCS}$ of the CCS 10 is dominated by the inductive impedance. In the time period t1, it is assumed that the impedance of the sensing inductance $L_S$ is initially greater than $K_I$ times of the impedance $Z_C$ of the output capacitor $C_O$ so that the (ripple of the) sensor voltage signal $V_{CCS}$ is initially less than the (ripple of the) output inductor current $I_L$. During the time period t1, i.e., in an inductance-calibrating frequency $f_L$, the impedance $Z_{CCS}$ of the CCS 10 is gradually matched to the impedance $Z_C$ of the output capacitor $C_O$.

Figure 5B:
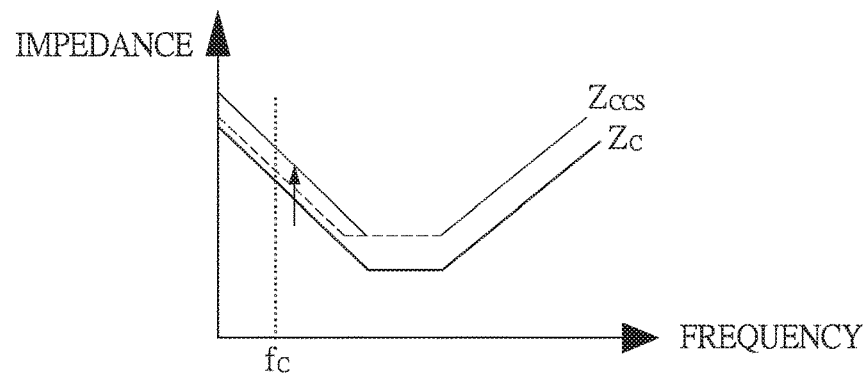
FIG. 5B is a schematic view of calibrating a sensing capacitance.

Similarly, FIG. 5B and a time period t2 in FIG. 4 show that the sensing capacitance $C_S$ of the CCS 10 is calibrated from a dotted line to a solid line. In a low frequency, the impedance $Z_{CCS}$ of the CCS 10 is dominated by the capacitive impedance. In the time period t2, it is assumed that the impedance of the sensing capacitance $C_S$ is initially less than $K_I$ times of the impedance $Z_C$ of the output capacitor $C_O$ so that the (ripple of the) sensor voltage signal $V_{CCS}$ is initially greater than the (ripple of the) output inductor current $I_L$. During the time period t2, i.e., in a capacitance-calibrating frequency $f_C$, the impedance $Z_{CCS}$ of the CCS 10 is gradually matched to the impedance $Z_C$ of the output capacitor $C_O$.

Figure 5C:
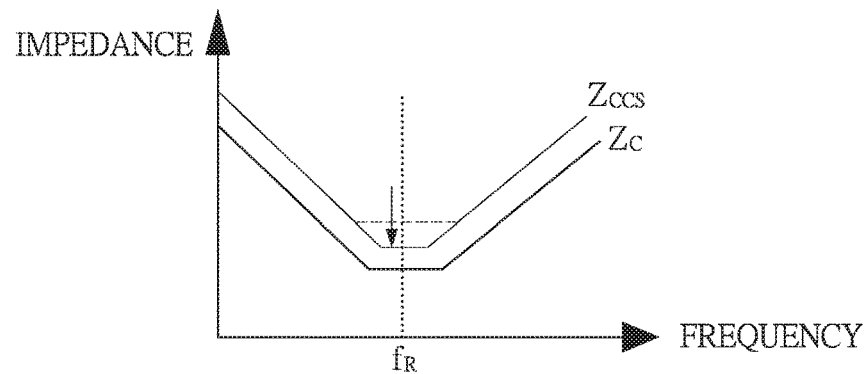
FIG. 5C is a schematic view of calibrating a sensing resistance.

Similarly, FIG. 5C and a time period t3 in FIG. 4 show that the sensing resistance $R_S$ of the CCS 10 is calibrated from a dotted line to a solid line. In an intermediate frequency, the impedance $Z_{CCS}$ of the CCS 10 is dominated by the resistive impedance. In the time period t3, it is assumed that the impedance of the sensing resistance $R_S$ is initially greater than $K_I$ times of the impedance $Z_C$ of the output capacitor $C_O$ so that the (ripple of the) sensor voltage signal $V_{CCS}$ is initially less than the (ripple of the) output inductor current $I_L$. During the time period t3, i.e., in a resistance-calibrating frequency $f_R$, the impedance $Z_{CCS}$ of the CCS 10 is gradually matched to the impedance $Z_C$ of the output capacitor $C_O$.

Accordingly, the sensing inductance $L_S$ of the CCS 10, the sensing capacitance $C_S$ of the CCS 10, and the sensing resistance $R_S$ of the CCS 10 are sequentially calibrated to implement the impedance-matching calibration of the CCS 10 in the buck converter.

In particular, the inductance-calibrating frequency $f_L$ and the capacitance-calibrating frequency $f_C$ are selected based on the output capacitor $C_O$ and consideration of the parasitic effect of a printed circuit board (PCB). In addition, one of the inductance-calibrating frequency $f_L$ and the capacitance-calibrating frequency $f_C$ is first selected and the other of the two frequencies is then selected since the ranges of the inductance-calibrating frequency $f_L$ and the capacitance-calibrating frequency $f_C$ are widely and easily to be selected. On the contrary, it is difficult to select the resistance-calibrating frequency $f_R$ due to a narrow frequency range of the resistance-calibrating frequency $f_R$. Accordingly, the resistance-calibrating frequency $f_R$ is last selected and the value thereof is determined by the output capacitance $C_O$ and the parasitic inductance $L_{Co}$, typically the selected resistance-calibrating frequency $f_R$ is a resonant frequency associated with both the output capacitance $C_O$ and the parasitic inductance $L_{Co}$.

Figure 6:
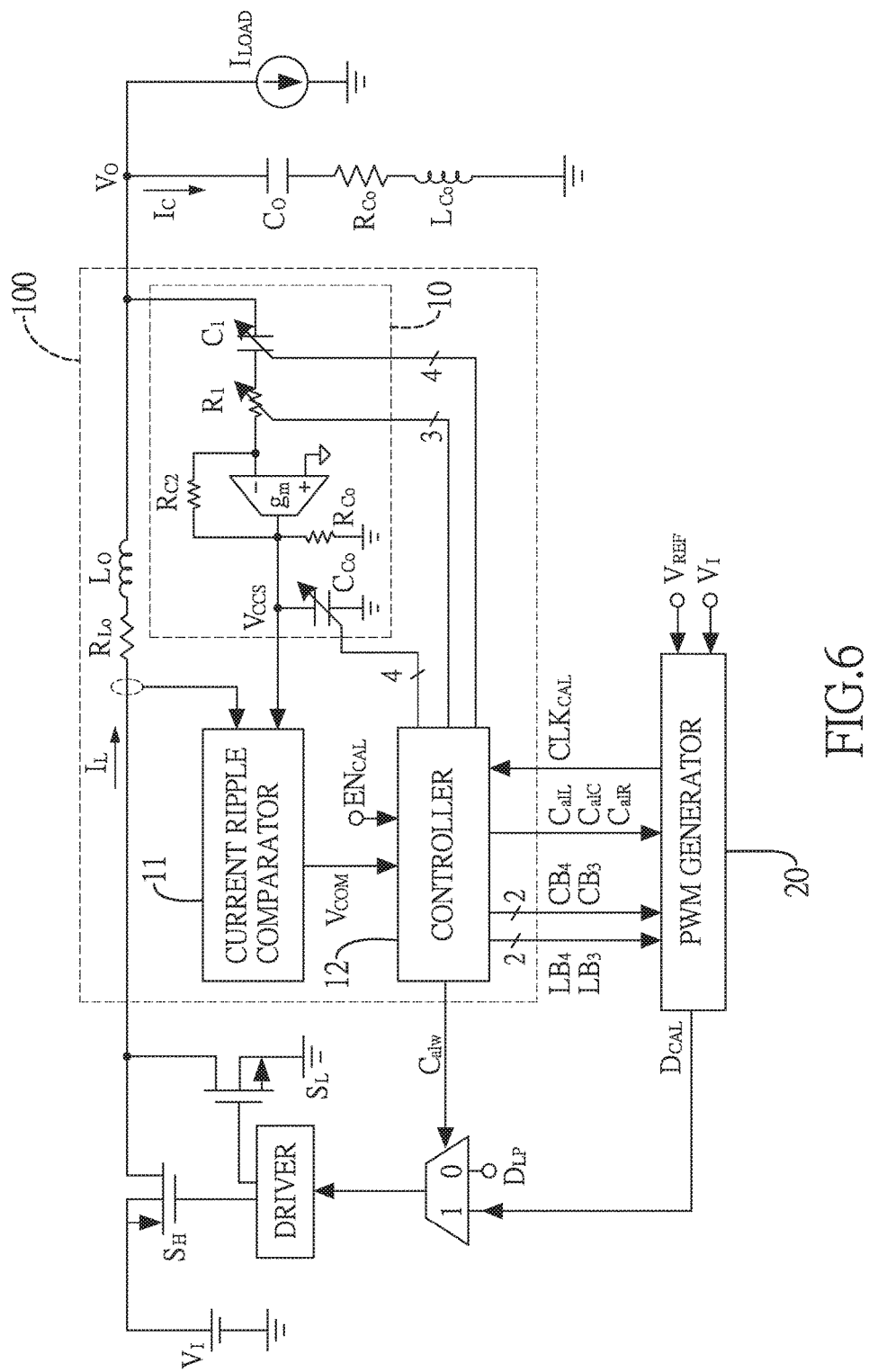
FIG. 6 is a circuit diagram of the buck converter with the CCS.

FIG. 6 shows the CCS with the impedance-matching calibration. The CCS 10 is parallel-connected with the impedance $Z_C$ of the output capacitor $C_O$ and the CCS 10 includes a tunable resistance R1, a tunable capacitance C1, a conversion resistor $R_{C2}$, and an operational amplifier (OPA) with its trans-conductance gm and output capacitor $C_{Co}$. The equivalent impedance $Z_{CCS}$ of the CCS 10 emulates the scaled replica of the impedance $Z_C$ of the output capacitor $C_O$ with the sensing parameters $C_S$, $R_S$ and $L_S$ for which the corresponding equations are as follows:

$$C_S \approx C_1 R_{C2},\ R_S \approx \frac{R_1}{R_{C2}},\ \text{and}\ L_S \approx \frac{C_{Co}}{gm}$$

During the calibration of the CCS 10, the buck converter is operated under an open-loop control with only one phase ($\Phi 1$) that is driven by a PWM signal with a duty cycle $D_{CAL}$, and the output voltage $V_O$ is regulated to its target voltage. Under the open-loop control, a closed-loop control signal $D_{LP}$ is disabled. In particular, the duty cycle $D_{CAL}$ of the PWM signal is equal to a ratio of the output voltage $V_O$ to the input voltage $V_I$. In a steady state, the output capacitor current $I_C$ is equal to the output inductor current $I_L$ under the different switching frequencies fsw of the duty cycle $D_{CAL}$ since the load current $I_{LOAD}$ is constant. The output capacitor current $I_C$ is compared with the output inductor current $I_L$ under the inductance-calibrating frequency $f_L$, the capacitance-calibrating frequency $f_C$, and the resistance-calibrating frequency $f_R$ to ensure that the impedance $Z_C$ of the output capacitor $C_O$ is respectively dominated by the parasitic inductance $L_{Co}$, the output capacitance $C_O$, and the parasitic resistance $R_{Co}$ so that the variations of the output capacitor $C_O$ are identified.

The detailed operation of the CCS 10 with the impedance-matching calibration will be described hereinafter as follows.

The impedance-matching calibration of the CCS 10 is executed at any time when the buck converter is operated in the zero-degree phase ($\Phi 1$) and other phases ($\Phi 2$, $\Phi 3$ and $\Phi 4$) are turned off by an off-chip switch. It means that the impedance-matching calibration of the CCS 10 is enabled after the dynamic voltage scaling (DVS) to contract the variation caused by the direct current (DC) bias variation. Moreover, the load current $I_{LOAD}$ is not limited to be zero.

The buck converter is operated under the open-loop control when the calibration of the CCS 10 is enabled. The high-side switch $S_H$ and the low-side switch $S_L$ are controlled by the PWM signal with the duty cycle $D_{CAL}$ generated by a PWM generator 20. In particular, the duty cycle $D_{CAL}$ is determined by the input voltage $V_I$ and a reference voltage $V_{REF}$.

Figure 7:
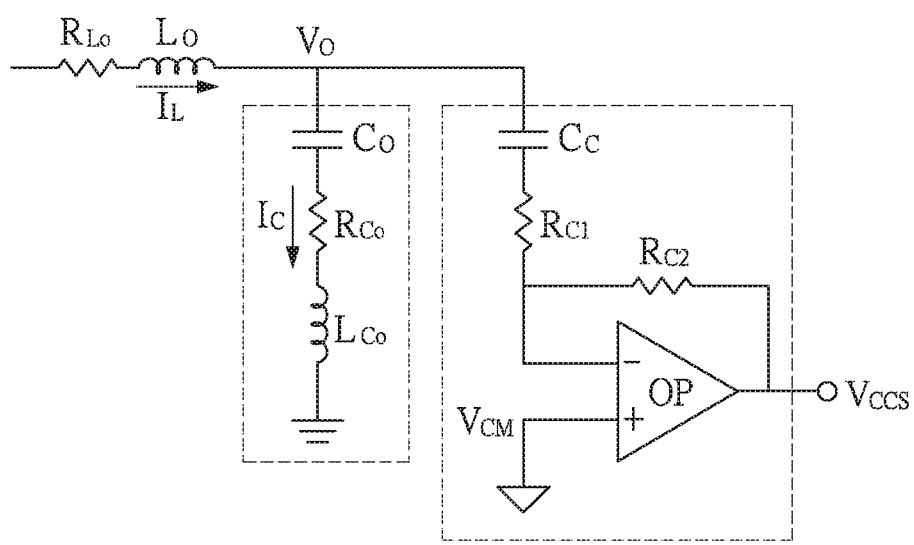
FIG. 7 is a circuit diagram of an active CCS.

FIG. 7 shows an active capacitor current sensor composed of an operational amplifier and a resistor-capacitor network composed of a first sensing resistor $R_{C1}$, a second sensing resistor $R_{C2}$, and a sensing capacitor $C_C$. In particular, the equivalent in-series impedance $Z_{CCS}$ of the CCS 10 with the sensing parameters $C_S$, $R_S$ and $L_S$ for which the corresponding equations are as follows:

$$C_S \approx C_C R_{C2},\ R_S \approx \frac{R_{C1}}{R_{C2}},\ \text{and}\ L_S \approx \frac{\text{output capacitor of } OP}{gm\ \text{of } OP}$$

Figure 8:
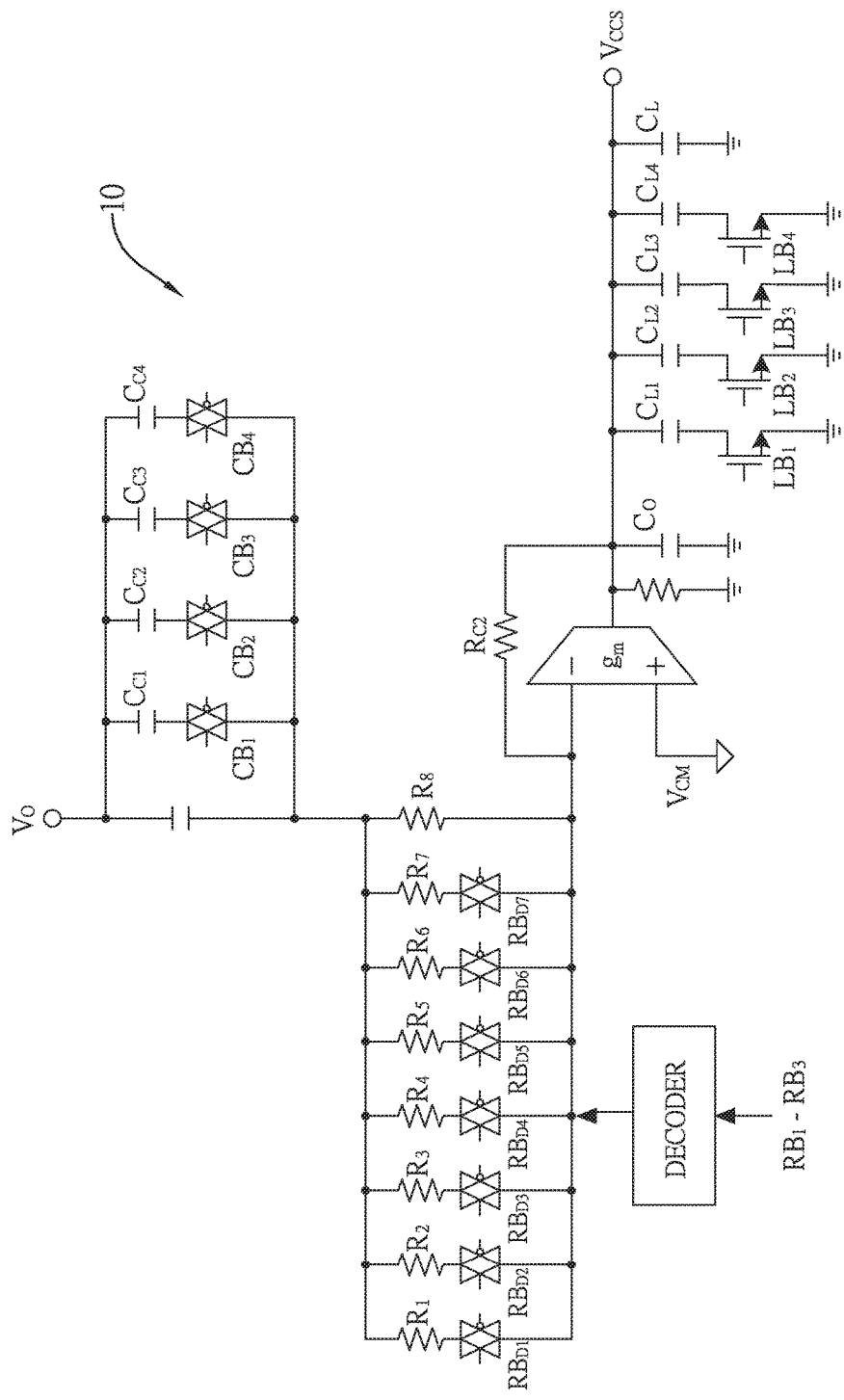
FIG. 8 is a circuit diagram of a tunable impedance-matching CCS.

FIG. 8 shows a tunable impedance-matching CCS 10 that is used to implement the active CCS. A first capacitor array is used to calibrate the sensing capacitance $C_S$ and the first capacitor array is a four-bit capacitor array with four capacitors $C_{C1}$-$C_{C4}$. In particular, the four capacitors $C_{C1}$-$C_{C4}$ associated with the conversion resistor $R_{C2}$ are designed to cover the impedance range of the output capacitance $C_O$. Each of the capacitors $C_{C1}$-$C_{C4}$ is connected to a respective switch component in series. The switch components are controlled by the $CB_1$-$CB_4$ to connect the corresponding capacitors $C_{C1}$-$C_{C4}$ in parallel to each other. In addition, a second capacitor array is used to calibrate the sensing inductance $L_S$ and the second capacitor array is a four-bit capacitor array with four capacitors $C_{L1}$-$C_{L4}$. Each of the capacitors $C_{L1}$-$C_{L4}$ is connected to a respective switch component in series. The switch components are controlled by the $LB_1$-$LB_4$ to connect the corresponding capacitors $C_{L1}$-$C_{L4}$ in parallel to each other.

Furthermore, a resistor array is used to calibrate the sensing resistance $R_S$ and the resistor array is a three-bit resistor array with three resistors. A 3-to-8 decoder is connected to the eight resistors $R_1$-$R_8$ that are connected to corresponding switch component in series. The 3-to-8 decoder receives the $RB_1$-$RB_3$ and decodes the $RB_1$-$RB_3$ into at least seven signals $RB_{D1}$-$RB_{D7}$ to control the corresponding switch components, respectively. The switch components are controlled to connect the corresponding resistors $R_1$-$R_8$ in parallel to each other. In particular, the eight resistors $R_1$-$R_8$ associated with the conversion resistor $R_{C2}$ are designed to cover the impedance range of the parasitic resistance $R_{Co}$.

Still with reference to FIG. 6, the switching frequency $f_{SW}$ of the PWM signal is set to the inductance-calibrating frequency $f_L$ for calibrating $LB_1$-$LB_4$ of the CCS 10 since the impedance $Z_C$ of the output capacitor $C_O$ is dominated by the parasitic inductance $L_{Co}$. Also, a sample and hold circuit inside a current ripple comparator 11 obtains ripple information of the output inductor current $I_L$ from an inductor current sensor and ripple information of the output capacitor current $I_C$ from the CCS 10, respectively. In addition, the current ripple comparator 11 compares the output inductor current $I_L$ with the output capacitor current $I_C$ that is equal to $K_I$ times of the sensor voltage signal $V_{CCS}$. In particular, the sensor voltage signal $V_{CCS}$ is equal to the output capacitor current $I_C$ if the current sensing gain $K_I$ is set to 1.

After the calibration of the sensing inductance $L_S$ is accomplished, the calibration of the sensing capacitance $C_S$ is executed similarly to that of the sensing inductance $L_S$. The switching frequency $f_{SW}$ is changed from the inductance-calibrating frequency $f_L$ to the capacitance-calibrating frequency $f_C$ for calibrating $CB_1$-$CB_4$ of the CCS 10 since the impedance $Z_C$ of the output capacitor $C_O$ is dominated by the output capacitance $C_O$. Also, the sample and hold circuit obtains ripple information of the output inductor current $I_L$ from an inductor current sensor and ripple information of the output capacitor current $I_C$ from the CCS 10, respectively. In addition, the comparison circuit compares the output inductor current $I_L$ with the output capacitor current $I_C$ that is equal to $K_I$ times of the sensor voltage signal $V_{CCS}$.

After the calibration of the sensing inductance $L_S$ and the sensing capacitance $C_S$, the resistance-calibrating frequency $f_R$ is provided from the PWM generator 20. In particular, the resistance-calibrating frequency $f_R$ is determined according to the calibrated sensing inductance $L_S$ and the calibrated sensing capacitance $C_S$. More specifically, the resistance-calibrating frequency $f_R$ is determined by combining at least one weighted bit of the calibrated sensing inductance $L_S$ and at least one weighted bit of the calibrated sensing capacitance $C_S$. For example, the MSB (most significant bit) and the second MSB of the calibrated sensing inductance $L_S$ combine the MSB and the second MSB of the calibrated sensing capacitance $C_S$ to determine the resistance-calibrating frequency $f_R$. The switching frequency $f_{SW}$ is changed from the capacitance-calibrating frequency $f_C$ to the resistance-calibrating frequency $f_R$ for calibrating $RB_1$-$RB_3$ of the CCS 10 since the impedance $Z_C$ of the output capacitor $C_O$ is dominated by the parasitic resistance $R_{Co}$. Also, the sample and hold circuit obtains ripple information of the output inductor current $I_L$ from an inductor current sensor and ripple information of the output capacitor current $I_C$ from the CCS 10, respectively. In addition, the comparison circuit compares the output inductor current $I_L$ with the output capacitor current $I_C$ that is equal to $K_I$ times of the sensor voltage signal $V_{CCS}$.

Figure 9:
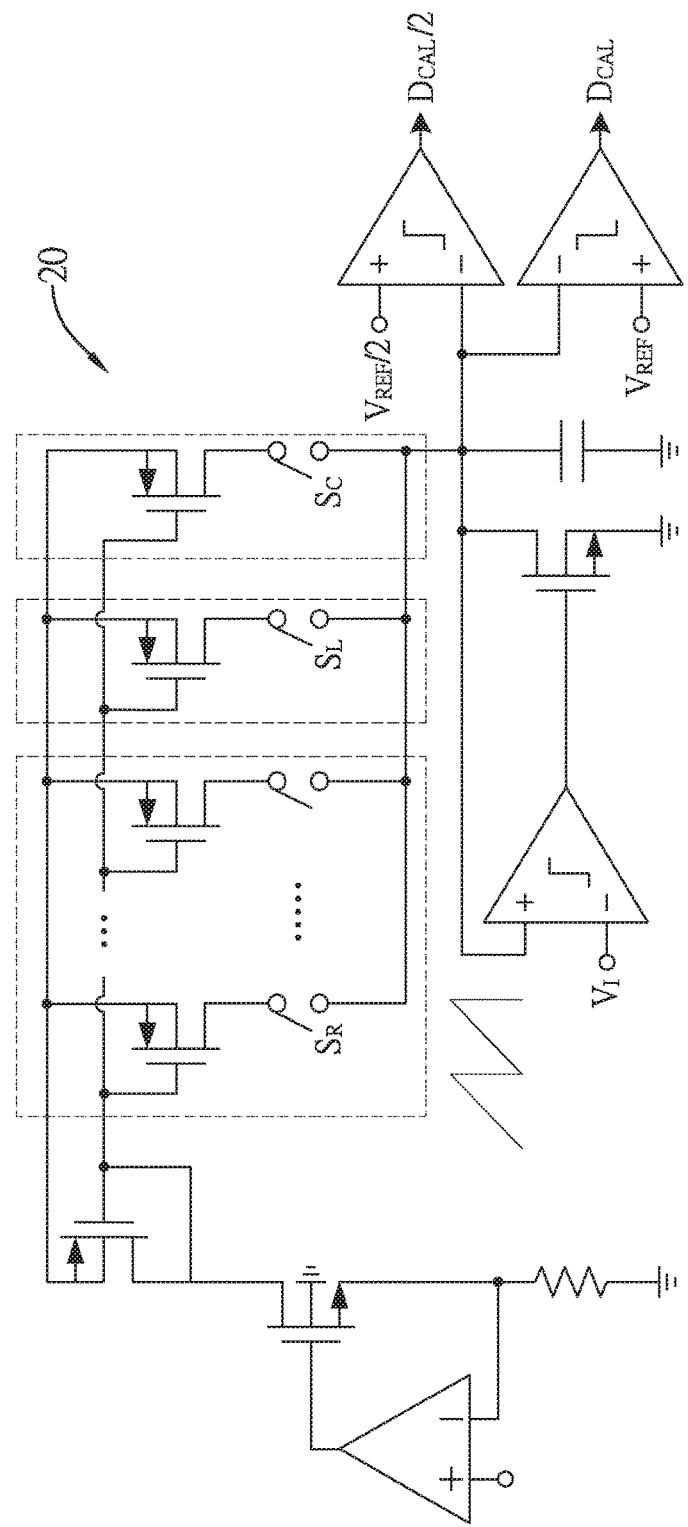
FIG. 9 is a circuit diagram of generating a duty cycle of a PWM signal.

FIG. 9 shows the generation of the duty cycle $D_{CAL}$ and the selection of the switching frequency $f_{SW}$. The input voltage $V_I$ and the reference voltage $V_{REF}$ are provided to generate the duty cycle $D_{CAL}$. Further, a half of the duty cycle $D_{CAL}/2$ is generated by the input voltage $V_I$ and a half of the reference voltage $V_{REF}/2$.

The duty cycle $D_{CAL}$ is provided to the sample and hold circuit to obtain the peak value of the output inductor current $I_L$ and the peak value of the output capacitor current $I_C$. The half of the duty cycle $D_{CAL}/2$ is provided to the sample and hold circuit to obtain the average value of the output inductor current $I_L$ and the average value of the output capacitor current $I_C$.

The ripple of the output inductor current $\Delta I_L$ is acquired by subtracting the average value of the output inductor current $I_L$ from the peak value of the output inductor current $I_L$ by a subtracting circuit. Also, the ripple of the output capacitor current $\Delta V_{CCS}$ is acquired by subtracting the average value of the output capacitor current $I_C$ from the peak value of the output capacitor current $I_C$ by the subtracting circuit.

In addition, a capacitance calibration switch $S_C$, an inductance calibration switch $S_L$, and numbers of resistance calibration switches $S_R$ are used to control which one of the switching frequencies is selected.

During the calibration of the CCS 10, the buck converter is operated under the open-loop control and the PWM signal in the zero-degree phase is controlled by the duty cycle $DC_{AL}$ so as to regulate the output voltage $V_O$ to the target voltage $V_{TRG}$. For example, the inductance-calibrating frequency $f_L$ and the capacitance-calibrating frequency $f_C$ are designed to be 15 MHz and 4 MHz, respectively based on consideration of the parasitic effect of the PCB. Furthermore, the resistance-calibrating frequency $f_R$ is designed by the weighted bits, i.e., the MSB and the second MSB of the calibrated sensing inductance $L_S$ and the weighted bits, i.e., the MSB and the second MSB of the calibrated sensing capacitance $C_S$.

For example, the exemplified values in Table 1 and Table 2 are listed for further demonstration as follows.

TABLE 1

| $LB_4LB_3CB_4CB_3$ | 1100 | 1101 | 1110 | 1111 |
|---|---|---|---|---|
| $f_R$ (MHz) | 6.08~7.64 | 5.18~6.23 | 4.64~5.46 | 4.29~5.00 |
| $LB_4LB_3CB_4CB_3$ | 1000 | 1001 | 1010 | 1011 |
| $f_R$ (MHz) | 6.69~8.56 | 5.74~7.11 | 5.16~6.28 | 4.70~5.50 |
| $LB_4LB_3CB_4CB_3$ | 0100 | 0101 | 0110 | 0111 |
| $f_R$ (MHz) | 7.64~10.0 | 6.60~8.41 | 6.00~7.55 | 5.40~6.86 |
| $LB_4LB_3CB_4CB_3$ | 0000 | 0001 | 0010 | 0011 |
| $f_R$ (MHz) | 9.90~13.9 | 8.00~10.9 | 7.42~10.2 | 6.74~9.13 |

In Table 1, the sequence of bits "$LB_4LB_3CB_4CB_3$" "–expresses the MSB and the second MSB of the calibrated sensing inductance $L_S$ ($LB_4LB_3$) and the MSB and the second MSB of the calibrated sensing capacitance $C_S$ ($CB_4CB_3$). The different values of the sequence of bits "$LB_4LB_3CB_4CB_3$" "–are designated into different frequency ranges. For example, the resistance-calibrating frequency $f_R$ is determined between 4.70 MHz and 5.50 MHz when $LB_4LB_3CB_4CB_3$="1011".

TABLE 2

| | $LB_4LB_3CB_4CB_3$ | | | | |
|---|---|---|---|---|---|
| | 1101 | | | | |
| 1111 | 1001 | 1100 | | 0001 | |
| 1110 | 1010 | 0110 | 0011 | 0100 | |
| 1011 | 0111 | 1000 | 0101 | 0010 | 0000 |
| $f_R$ (MHz) 5.00 | 6.00 | 7.00 | 8.00 | 9.00 | 12.0 |

In Table 2, the nearby frequencies are classified into the same resonant frequency. For example, the resistance-calibrating frequency $f_R$, i.e., the resonant frequency, is 5.00 MHz if $LB_4LB_3CB_4CB_3$="1011". Therefore, the resistance-calibrating frequency $f_R$ is determined to be 5.00 MHz when the MSB and the second MSB of the calibrated sensing inductance $L_S$ ($LB_4LB_3$) are "10" and the MSB and the second MSB of the calibrated sensing capacitance $C_S$ ($CB_4CB_3$) are "11".

Figure 10:
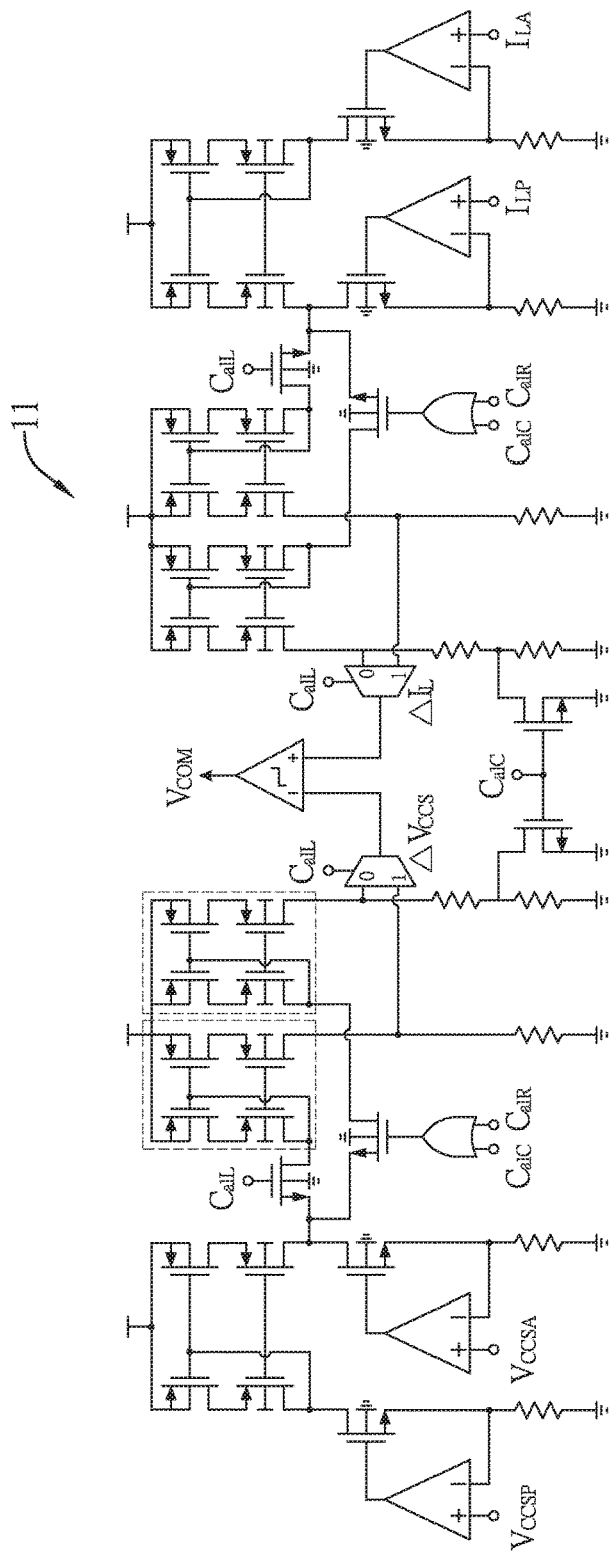
FIG. 10 is a circuit diagram of a comparison circuit of ripple of an output inductor current and ripple of an output capacitor current.

FIG. 10 shows the comparison of the ripple of the output inductor current $\Delta I_L$ and the ripple of the output capacitor current $\Delta V_{CCS}$. The peak value of the output capacitor current $V_{CSSP}$, the average value of the output capacitor current $V_{CCSA}$, the inductance calibration signal $Cal_L$, the capacitance calibration signal $Cal_C$, and the resistance calibration signal $Cal_R$ are all provided to generate the ripple of the output capacitor current $\Delta V_{CCS}$. Also, the peak value of the output inductor current $I_{LP}$, the average value of the output inductor current $I_{LA}$, the inductance calibration signal $Cal_L$, the capacitance calibration signal $Cal_C$, and the resistance calibration signal $Cal_R$ are provided to generate the ripple of the output inductor current $\Delta I_L$. The ripple of the output capacitor current $\Delta V_{CCS}$ is compared with the ripple of the output inductor current $\Delta I_L$ to generate a comparison signal $V_{COM}$.

If the ripple of the output inductor current $\Delta I_L$ is greater than the ripple of the output capacitor current $\Delta V_{CCS}$ during the calibration of the sensing inductance $L_S$, it means that the equivalent impedance of the sensing inductance $L_S$ is too large, that is, the sensing inductance $L_S$ is too large. On the contrary, if the ripple of the output inductor current $\Delta I_L$ is not greater than the ripple of the output capacitor current $\Delta V_{CCS}$ during the calibration of the sensing inductance $L_S$, it means that the equivalent impedance of the sensing inductance $L_S$ is too small, that is, the sensing inductance $L_S$ is too small.

If the ripple of the output inductor current $\Delta I_L$ is greater than the ripple of the output capacitor current $\Delta V_{CCS}$ during the calibration of the sensing capacitance $C_S$, it means that the equivalent impedance of the sensing capacitance $C_S$ is too large, that is, the sensing capacitance $C_S$ is too small. On the contrary, if the ripple of the output inductor current $\Delta I_L$ is not greater than the ripple of the output capacitor current $\Delta V_{CCS}$ during the calibration of the sensing capacitance $C_S$, it means that the equivalent impedance of the sensing capacitance $C_S$ is too small, that is, the sensing capacitance $C_S$ is too large.

If the ripple of the output inductor current $\Delta I_L$ is greater than the ripple of the output capacitor current $\Delta V_{CCS}$ during the calibration of the sensing resistance $R_S$, it means that the equivalent impedance of the sensing resistance $R_S$ is too large, that is, the sensing resistance $R_S$ is too large. On the contrary, if the ripple of the output inductor current $\Delta I_L$ is not greater than the ripple of the output capacitor current $\Delta V_{CCS}$ during the calibration of the sensing resistance $R_S$, it means that the equivalent impedance of the sensing resistance $R_S$ is too small, that is, the sensing resistance $R_S$ is too small.

Figure 11:
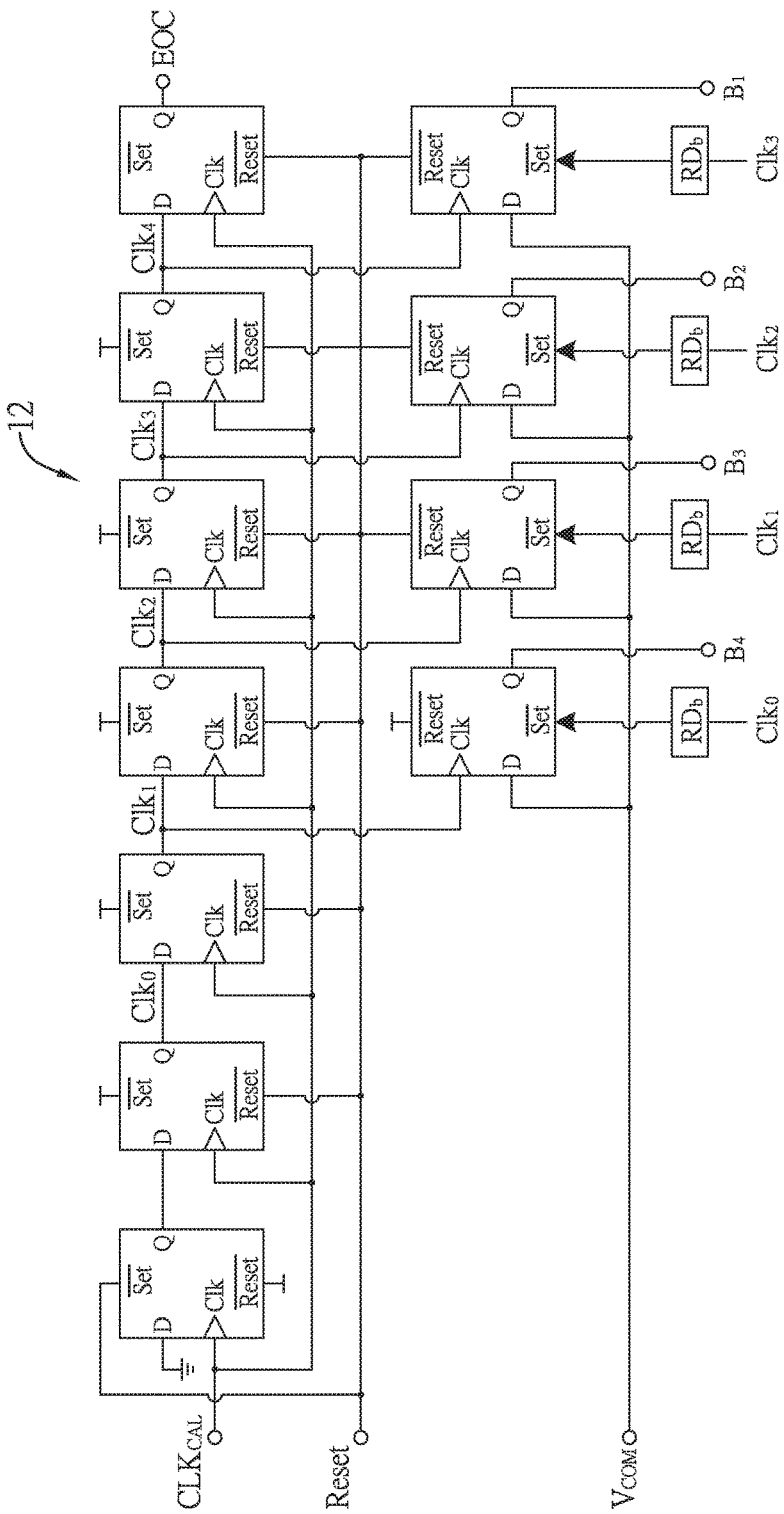
FIG. 11 is a circuit diagram of a controller.

FIG. 11 shows the controller providing a sequential logic circuit composed of a plurality of D-type flip-flops to implement the calibration of the CCS 10. The four output bits $B_4$ to $B_1$ are provided to generate the corresponding bit value for the sensing inductance $L_S$, the sensing capacitance $C_S$, and the sensing resistance $R_S$. Also, the EOC (end of calibration) is equal to 1 when the three sensing parameters are completely calibrated.

Figure 12:
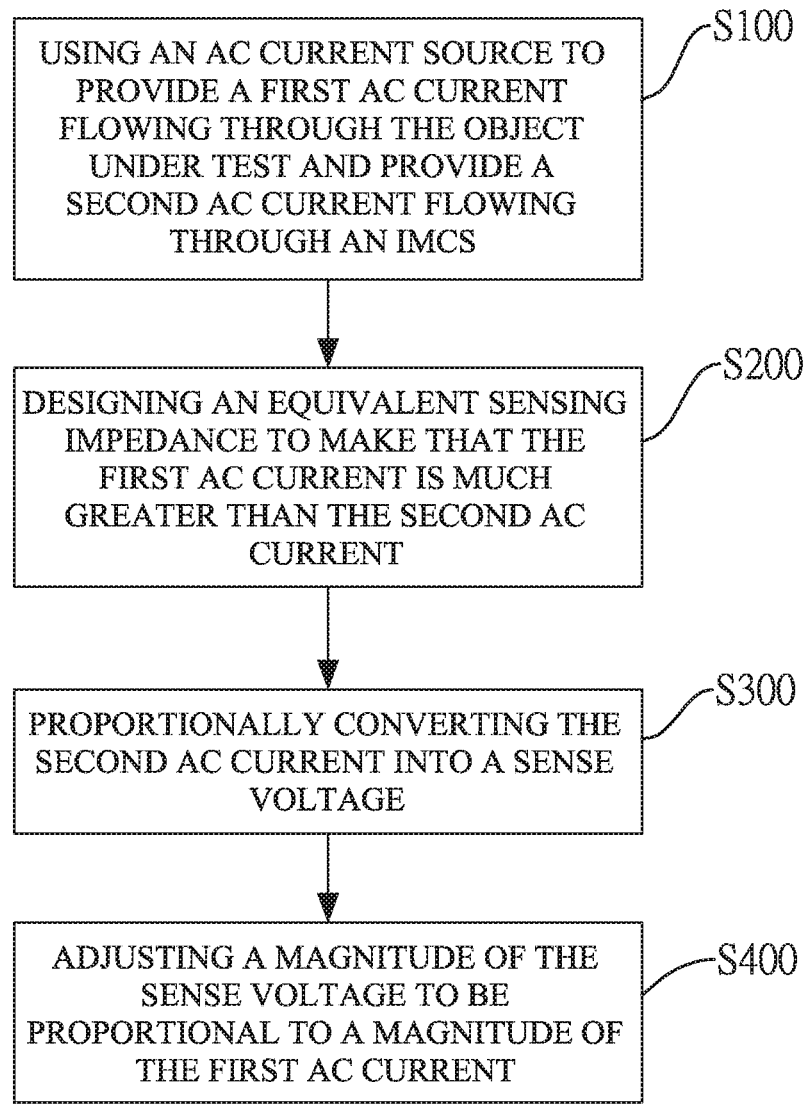
FIG. 12 is a flowchart of a method of calibrating an impedance-matching current sensor (IMCS)

FIG. 12 shows a flowchart of a method of calibrating in impedance-matching current sensor (IMCS). The IMCS has an equivalent sensing impedance and is connected in parallel to an object under test. The equivalent sensing impedance of the IMCS is composed of at least two of a sensing inductance, a sensing capacitance, and a sensing resistance. For example, the equivalent sensing impedance of the IMCS may be an R-L impedance, an R-C impedance or an R-L-C impedance. The method includes the following steps.

First, an alternating-current (AC) current source is used to provide a first AC current flowing through the object under test and provide a second AC current flowing through the IMCS (S100). Afterward, the equivalent sensing impedance is designed to make the first AC current much greater than the second AC current (S200). As mentioned above, the equivalent sensing impedance is designed to be much greater than the impedance of the object under test to reduce the loading effect caused by the IMCS so that the first AC current is much greater than the second AC current.

Afterward, the second AC current into a sense voltage is proportionally converted (S300). By using a constant-gain converter such as a resistor, the second AC current flows through the resistor to generate a cross voltage between two ends of the resistor to obtain the sense voltage. Finally, a magnitude of the sense voltage is adjusted to be proportional to a magnitude of the first AC current (S400). The value of the resistor can be appropriately designed to make the magnitude of the sense voltage proportional, or even equal, to the magnitude of the first AC current.

Figure 13:
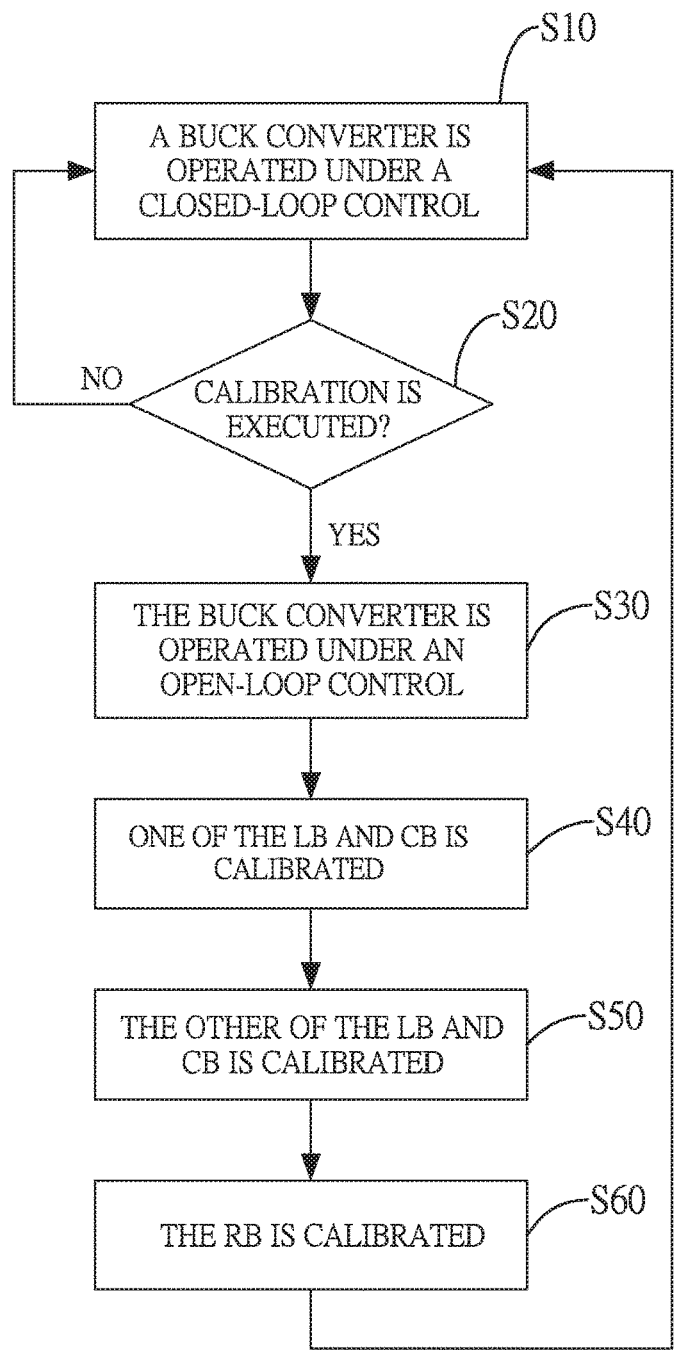
FIG. 13 is a flowchart of a method of an impedance-matching calibration of a capacitor current sensor in a buck converter.
Figure 14:
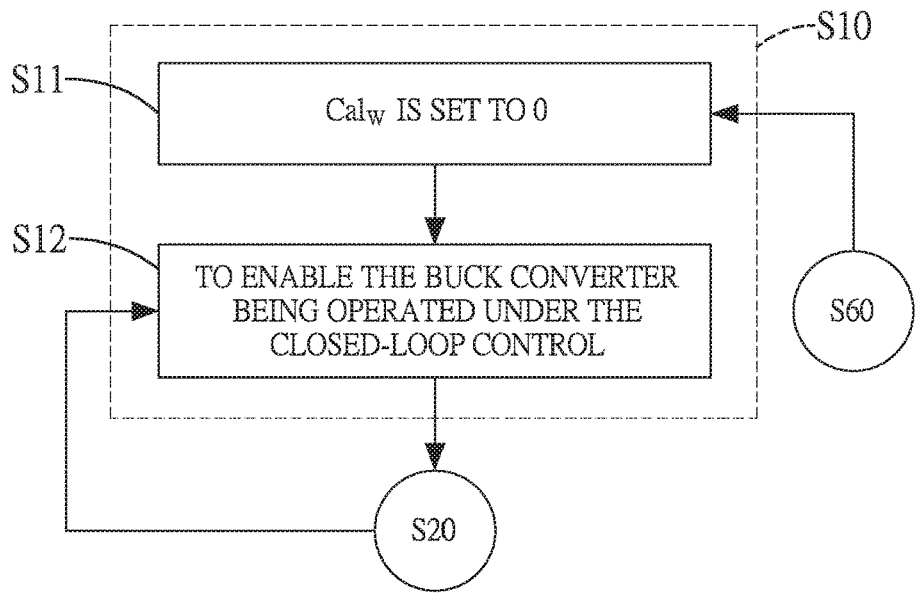
FIG. 14 is a flowchart showing the detailed operation of step S10 in FIG. 13.

FIG. 13 shows a brief overview of a method of calibrating the IMCS in a buck converter. The buck converter is operated under a closed-loop control (S10). FIG. 14 shows the detailed operation of the step (S10). A calibration window signal $Cal_W$ is set to 0 (S11) to connect a feedback path from the output voltage $V_O$, thus enabling the buck converter being operated under the closed-loop control (S12).

Figure 15:
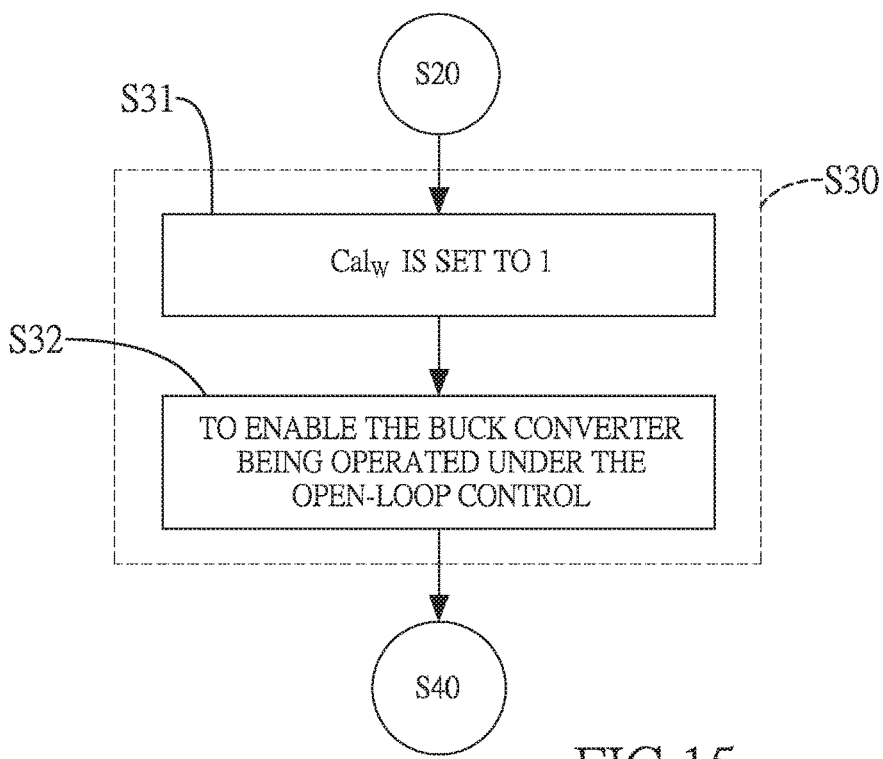
FIG. 15 is a flowchart showing the detailed operation of step S30 in FIG. 13.

Afterward, a controller judges whether the calibration of the CCS is executed (S20). More specifically, a calibration enable signal $EN_{CAL}$ is provided to judge whether the calibration of the CCS is executed. When the calibration enable signal $EN_{CAL}$ is set from 0 to 1, the calibration of the CCS is enabled to be executed. On the contrary, if the calibration enable signal $EN_{CAL}$ is set to 0, is set from 1 to 0, or is set to 1, the calibration of the CCS is disabled. If the calibration of the CCS is not executed, the buck converter is still operated under the closed-loop control. On the contrary, the buck converter is operated under an open-loop control instead of the closed-loop control when the calibration of the CCS is executed (S30). FIG. 15 shows the detailed operation of the step (S30). The calibration window signal $Cal_W$ is set to 1 (S31) to disconnect the feedback path from the output voltage $V_O$, thus enabling the buck converter being operated under the open-loop control (S32).

Afterward, the controller selects one of the sensing inductance $L_S$ and the sensing capacitance $C_S$ to be calibrated (S40), and then the other of the sensing inductance $L_S$ and the sensing capacitance $C_S$ to be calibrated (S50). In particular, if the sensing inductance $L_S$ is first selected to be calibrated, the sensing capacitance $C_S$ is then selected to be calibrated after the calibration of the sensing inductance $L_S$ is accomplished. On the contrary, if the sensing capacitance $C_S$ is first selected to be calibrated, the sensing inductance $L_S$ is then selected to be calibrated after the calibration of the sensing capacitance $C_S$ is accomplished.

Finally, the sensing resistance $R_S$ is calibrated after the calibration of both the sensing inductance $L_S$ and the sensing capacitance $C_S$ is accomplished (S60). After all the sensing parameters $L_S$, $C_S$ and $R_S$ are completely calibrated, the calibration window signal $Cal_W$ is set to 0 (S11) shown in FIG. 14 to enable the buck converter being operated under the closed-loop control (S12).

Figure 16:
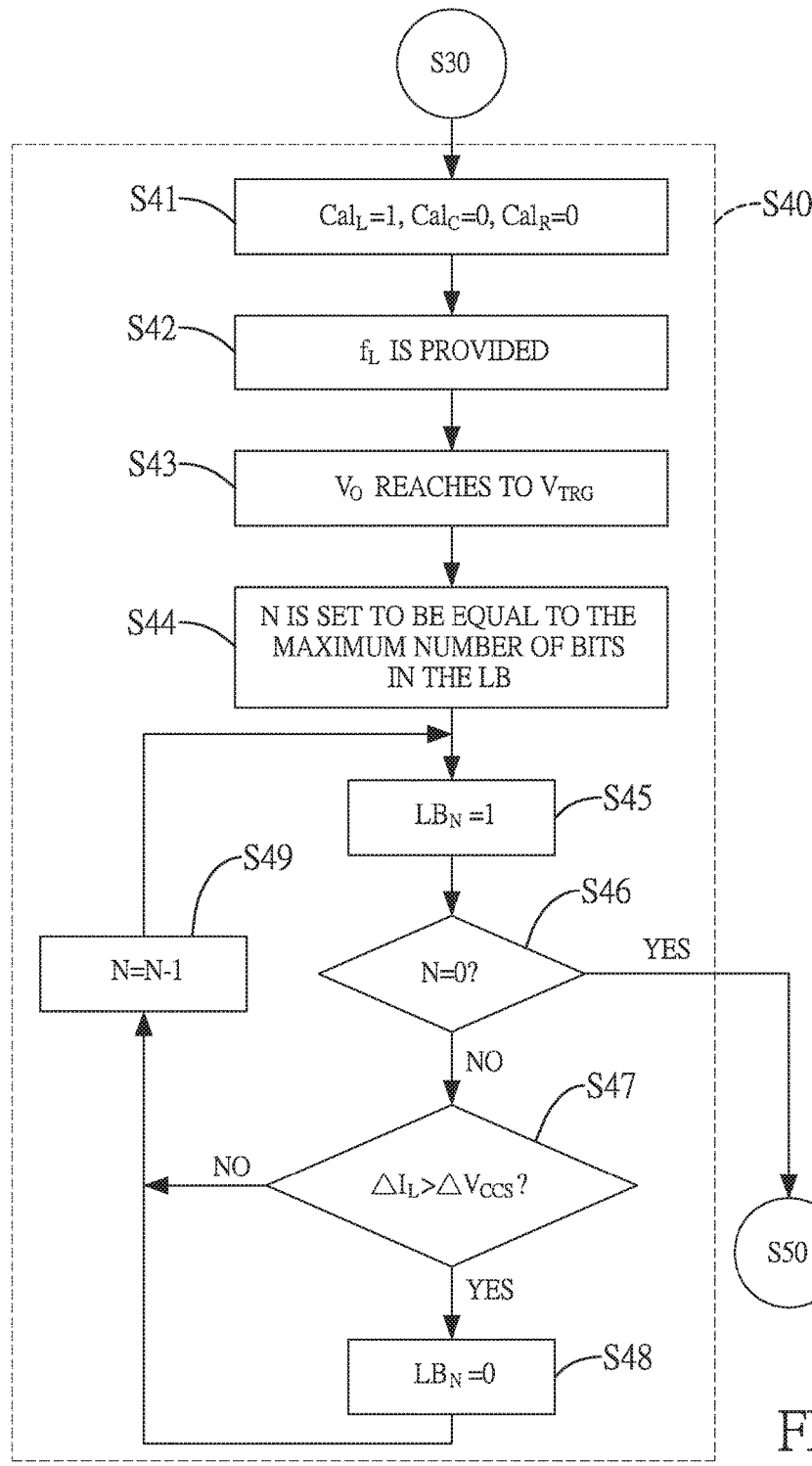
FIG. 16 is a flowchart showing the detailed operation of step S40 in FIG. 13.

FIG. 16 shows the detailed operation of the step (S40). It is assumed that the sensing inductance $L_S$ is first calibrated. An inductance calibration signal $Cal_L$ is set to 1 but a capacitance calibration signal $Cal_C$ and a resistance calibration signal $Cal_R$ are both set to 0 by the controller (S41). Afterward, the switching frequency $f_{SW}$ of the PWM signal generated from the PWM generator is set to a high-frequency switching frequency $f_L$ (S42). Afterward, the output voltage $V_O$ is regulated to a target voltage $V_{TRG}$ (S43). Afterward, a count value N is set to be equal to the maximum number of bits in the sensing inductance $L_S$ (S44). Therefore, the four bits in the sensing inductance $L_S$, i.e., the $LB_4$, $LB_3$, $LB_2$, and $LB_1$ are used to calibrate the sensing inductance $L_S$.

First, the MSB of the LB, i.e., the $LB_4$, is preset to 1 (S45). Afterward, it is to determine whether the ripple of the output inductor current $\Delta I_L$ is greater than the ripple of the output capacitor current $\Delta V_{CCS}$ that is proportional to the ripple of the output capacitor current $\Delta V_{CCS}$ (S47). If the ripple of the output inductor current $\Delta I_L$ is greater than the ripple of the output capacitor current $\Delta V_{CCS}$, it means that the sensing inductance $L_S$ is greater than the parasitic inductance $L_{Co}$, thus resetting the $LB_4$ from 1 to 0 (S48) to accomplish tuning the $LB_4$. On the contrary, if the ripple of the output inductor current $\Delta I_L$ is not greater than the ripple of the output capacitor current $\Delta V_{CCS}$ in the step (S47), it means that the sensing inductance $L_S$ is less than the parasitic inductance $L_{Co}$, thus accomplishing tuning the $LB_4$. After the $LB_4$ is tuned, the remaining bits of the sensing inductance $L_S$ are tuned (S49) until all bits of the sensing inductance $L_S$ are tuned (S46) so that the sensing inductance $L_S$ is completely calibrated and the next step (S50) is executed.

Figure 17:
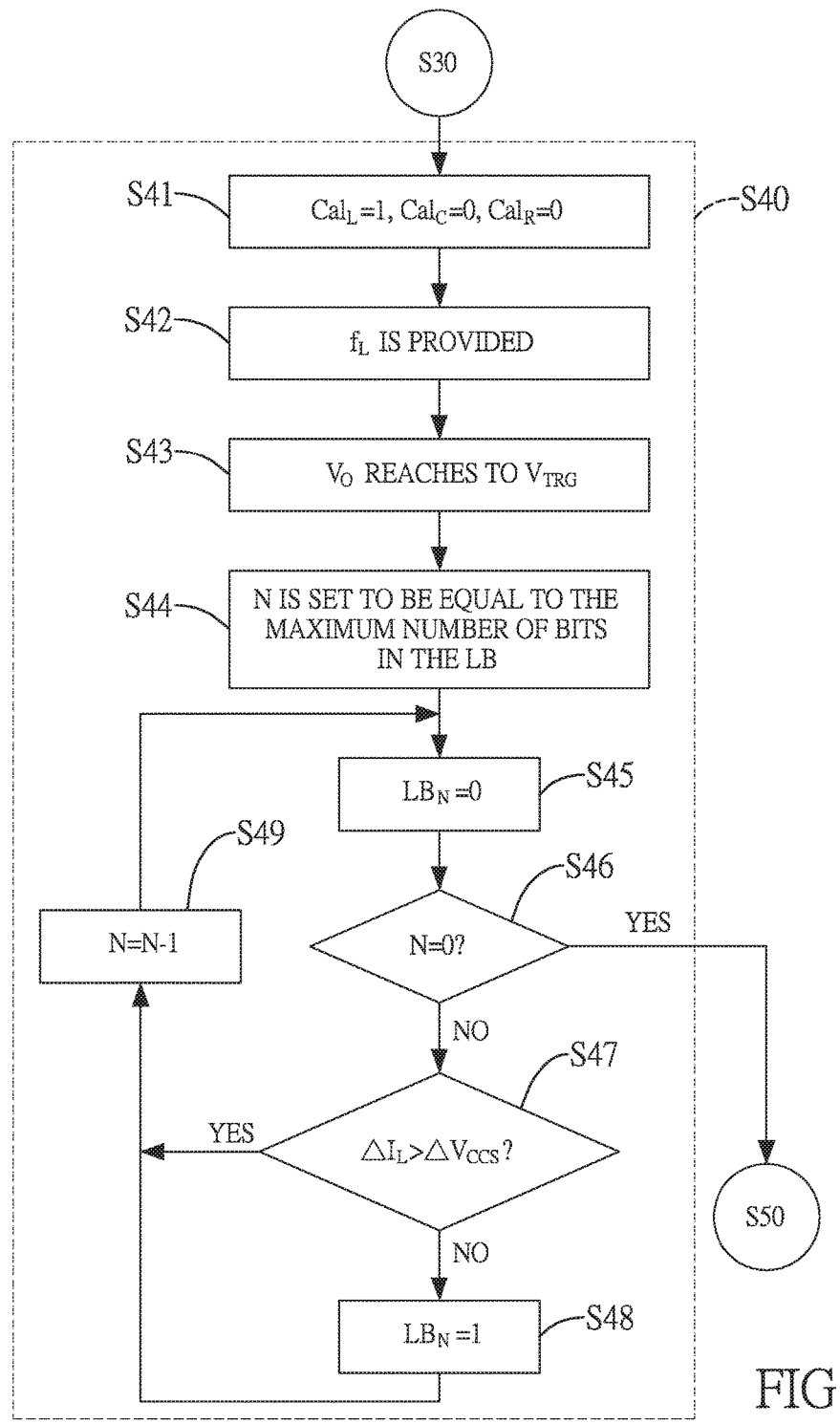
FIG. 17 is another flowchart showing the detailed operation of step S40 in FIG. 13.

FIG. 17 also shows the detailed operation of the step (S40). However, the difference between FIG. 17 and FIG. 16 is that the $LB_N$ is preset to 0 in the step (S45) and the $LB_N$ is reset from 0 to 1 in the step (S48) in the former. Therefore, the associated logic judgment in the step (S47) is correspondingly changed. Accordingly, the $LB_N$ is preset to 1 (shown in FIG. 16) or preset to 0 (shown in FIG. 17) to execute the calibration of the sensing parameters.

Figure 18:
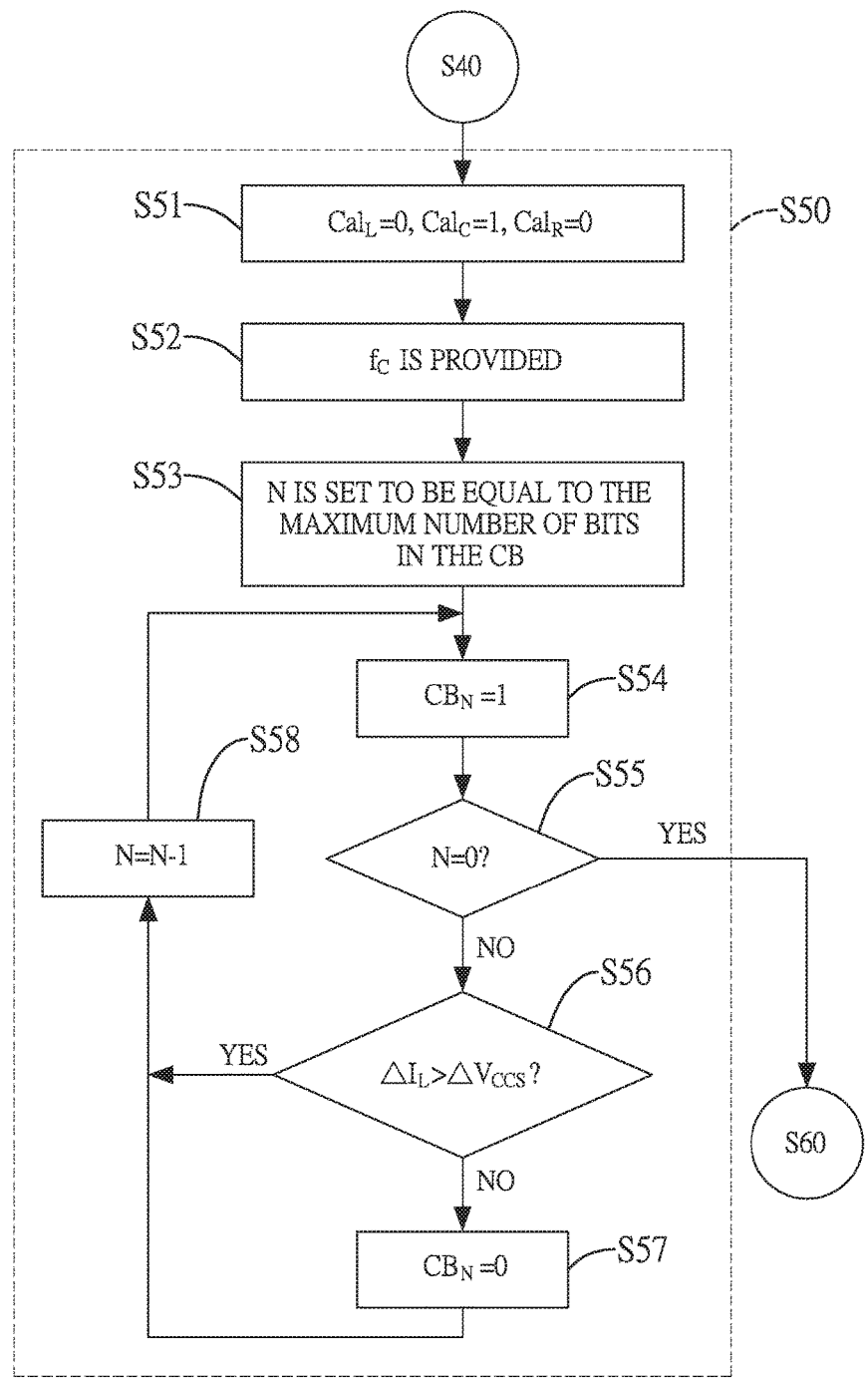
FIG. 18 is a flowchart showing the detailed operation of step S50 in FIG. 13.

FIG. 18 shows the detailed operation of the step (S50). After the sensing inductance $L_S$ is completely calibrated, another sensing capacitance $C_S$ is then calibrated. Note that, if the sensing capacitance $C_S$ is first calibrated in the step (S40), the sensing inductance $L_S$ is then calibrated in the step (S50). After the sensing inductance $L_S$ is completely calibrated in FIG. 16, the calibration of the sensing capacitance $C_S$ is described as follows.

First, the capacitance calibration signal $Cal_C$ is set to 1 but the inductance calibration signal $Cal_L$ and the resistance calibration signal $Cal_R$ are both set to 0 (S51). Afterward, the switching frequency $f_{sw}$ of the PWM signal generated from the PWM generator is set to a low-frequency switching frequency $f_C$ (S52). Afterward, a count value N is set to be equal to the maximum number of bits in the sensing capacitance $C_S$ (S53). Therefore, the four bits in the sensing capacitance $C_S$, i.e., the $CB_4$, $CB_3$, $CB_2$, and $CB_1$, are used to calibrate the sensing capacitance $C_S$.

First, the MSB of the CB, i.e., the $CB_4$, is preset to 1 (S54). Afterward, it is to judge whether the ripple of the output inductor current $\Delta I_L$ is greater than the ripple of the output capacitor current $\Delta V_{CCS}$ that is proportional to the ripple of the output capacitor current $\Delta V_{CCS}$ (S56). If the ripple of the output inductor current $\Delta I_L$ is not greater than the ripple of the output capacitor current $\Delta V_{CCS}$, it means that the sensing capacitance $C_S$ is less than the output capacitance $C_O$, thus resetting the $CB_4$ from 1 to 0 (S57) to accomplish tuning the $CB_4$. On the contrary, if the ripple of the output inductor current $\Delta I_L$ is greater than the ripple of the output capacitor current $\Delta V_{CCS}$ in the step (S56), it means that the sensing capacitance $C_S$ is greater than the output capacitance $C_O$, thus accomplishing tuning the $CB_4$. After the $CB_4$ is tuned, the remaining bits of the sensing capacitance $C_S$ are tuned (S58) until all bits of the sensing capacitance $C_S$ are tuned (S55) so that the sensing capacitance $C_S$ is completely calibrated and the next step (S60) is executed.

Similarly, the $CB_N$ is preset to 0 instead of 1 in the step (S54) and the $CB_N$ is reset from 0 to 1 in the step (S57). Therefore, the associated logic judgment in the step (S56) is correspondingly changed. The detail description is omitted here for conciseness.

Figure 19:
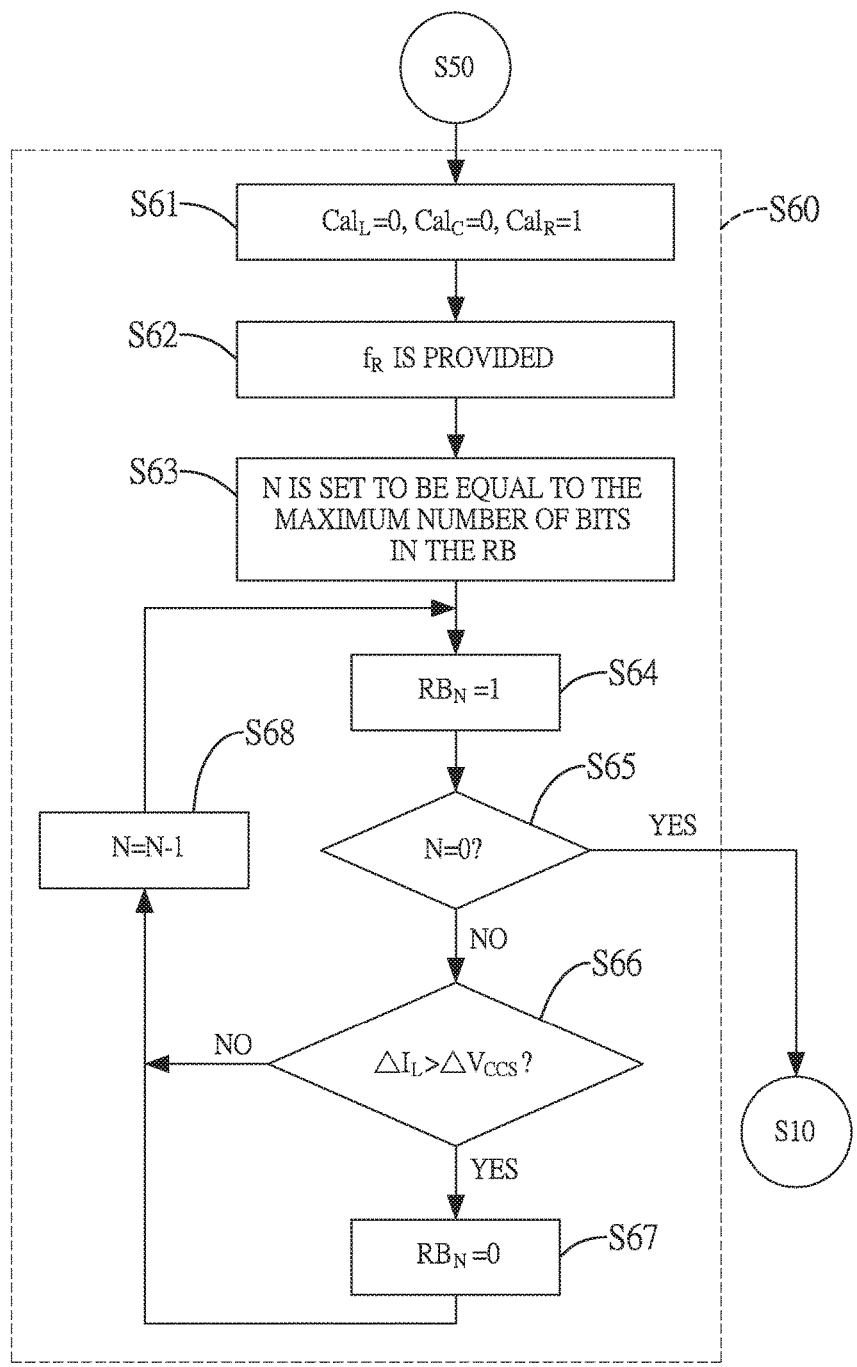
FIG. 19 is a flowchart showing the detailed operation of step S60 in FIG. 13.
Figure 20:
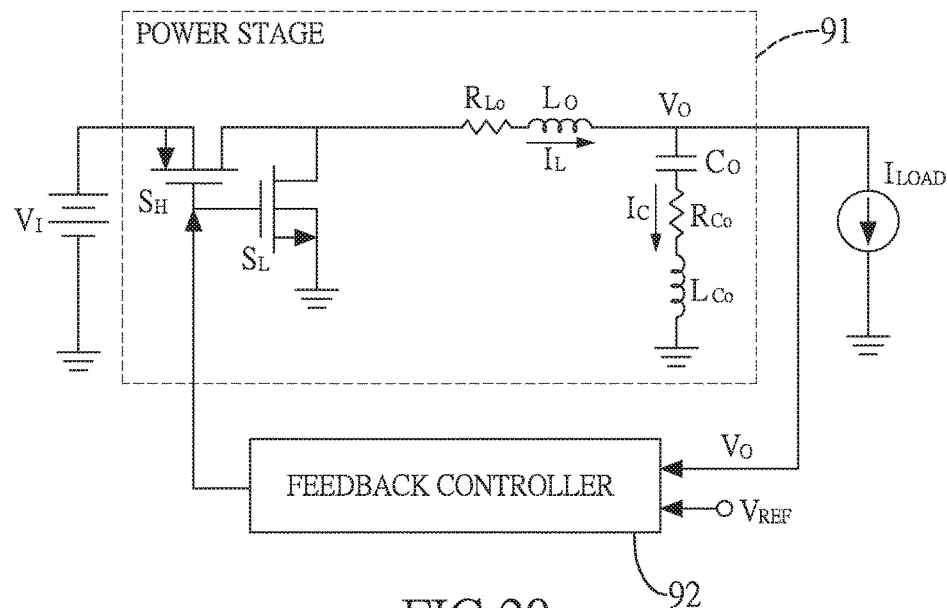
FIG. 20 is a block diagram of a conventional buck converter.
Figure 21:
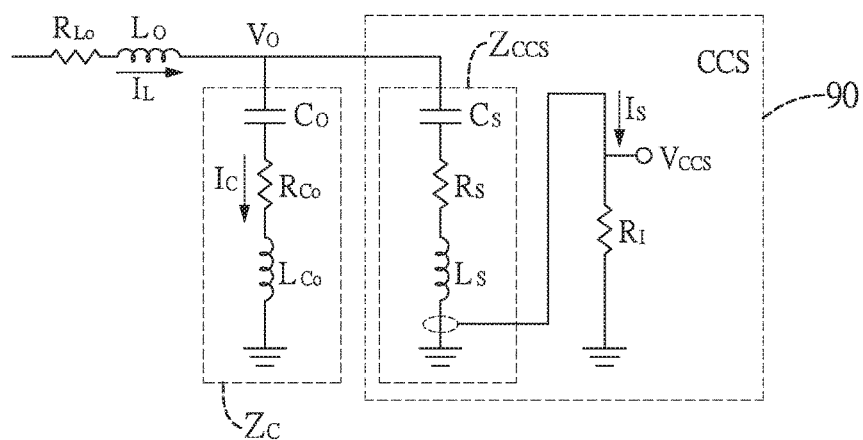
FIG. 21 is a circuit diagram of a capacitor current sensor.

FIG. 19 shows the detailed operation of the step (S60). After the sensing inductance $L_S$ and the sensing capacitance $C_S$ are completely calibrated, the last sensing parameter, i.e., the sensing resistance $R_S$ is then calibrated. First, the resistance calibration signal $Cal_R$ is set to 1 but the inductance calibration signal $Cal_L$ and the capacitance calibration signal $Cal_C$ are both set to 0 (S61). Afterward, the switching frequency $f_{SW}$ of the PWM signal generated from the PWM generator is set to an intermediate-frequency switching frequency $f_R$ (S62). The intermediate-frequency switching frequency $f_R$ is determined according to the weighted bits, i.e., the MSB and the second MSB of the calibrated sensing inductance $L_S$ and the weighted bits, i.e., the MSB and the second MSB of the calibrated sensing capacitance $C_S$. Afterward, a count value N is set to be equal to the maximum number of bits in the sensing resistance $R_S$ (S63). Therefore, the three bits in the sensing resistance $R_S$, i.e., the $RB_3$, $RB_2$, and $RB_1$ are used to calibrate the sensing resistance $R_S$.

First, the MSB of the RB, i.e., the $RB_3$, is preset to 1 (S64). Afterward, it is to judge whether the ripple of the output inductor current $\Delta I_L$ is greater than the ripple of the output capacitor current $\Delta V_{CCS}$ that is proportional to the ripple of the output capacitor current $\Delta V_{CCS}$ (S66). If the ripple of the output inductor current $\Delta I_L$ is greater than the ripple of the output capacitor current $\Delta V_{CCS}$, it means that the sensing resistance $R_S$ is greater than the parasitic resistance $R_{Co}$, thus resetting the $RB_3$ from 1 to 0 (S67) to accomplish tuning the $RB_3$. On the contrary, if the ripple of the output inductor current $\Delta I_L$ is not greater than the ripple of the output capacitor current $\Delta V_{CCS}$ in the step (S66), it means that the sensing resistance $R_S$ is less than the parasitic resistance $R_{Co}$, thus accomplishing tuning the $RB_3$. After the $RB_3$ is tuned, the remaining bits of the sensing resistance $R_S$ are tuned (S68) until all bits of the sensing resistance $R_S$ are tuned (S65) so that the sensing resistance $R_S$ is completely calibrated and the next step (S10) is executed.

Similarly, the $RB_N$ is preset to 0 instead of 1 in the step (S64) and the $RB_N$ is reset from 0 to 1 in the step (S67). Therefore, the associated logic judgment in the step (S66) is correspondingly changed. The detail description is omitted here for conciseness.

In conclusion, the present disclosure has the following advantage:

The CCS 10 effectively detects the variation of the output capacitor after calibration thereof by tuning sensing parameters in the CCS 10. Accordingly, it is to significantly overcome problems of unreliability and instability of the DC-to-DC conversion system caused by temperature, aging, DC bias variation, or parasitic effect, thus maintaining correct sensed results of the CCS 10 in transient response optimization.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A method of calibrating an impedance-matching current sensor (IMCS) in a buck converter, the IMCS having a sensing inductance, a sensing capacitance, and a sensing resistance connected in series, the method comprising steps of:

executing a calibration of the IMCS;
   operating the buck converter under an open-loop control;
   calibrating one of the sensing inductance and the sensing capacitance;
   calibrating the other of the sensing inductance and the sensing capacitance; and
   calibrating the sensing resistance.

2. The method of calibrating the IMCS in the buck converter as claimed in claim 1, wherein the step of calibrating the sensing inductance comprises steps of:
   enabling an inductance calibration signal and disabling a capacitance calibration signal and a resistance calibration signal;

providing an inductance-calibrating frequency;
regulating an output voltage of the buck converter to reach a target voltage;
setting a count value to be equal to a maximum number of bits in the sensing inductance; and
sequentially tuning all bits of the sensing inductance.

3. The method of calibrating the IMCS in the buck converter as claimed in claim 2, wherein the step of calibrating the sensing resistance comprises steps of:
enabling the resistance calibration signal and disabling the inductance calibration signal and the capacitance calibration signal;
providing a resistance-calibrating frequency;
setting a count value to be equal to the maximum number of bits in the sensing resistance; and
sequentially tuning all bits of the sensing resistance.

4. The method of calibrating the IMCS in the buck converter as claimed in claim 3, wherein the resistance-calibrating frequency is a resonant frequency determined by at least one weighted bit of the sensing inductance and at least one weighted bit of the sensing capacitance.

5. The method of calibrating the IMCS in the buck converter as claimed in claim 3, wherein an impedance of the IMCS is dominated by an inductive impedance in the inductance-calibrating frequency, the impedance of the IMCS is dominated by a resistive impedance in the resistance-calibrating frequency, and the impedance of the IMCS is dominated by a capacitive impedance in the capacitance-calibrating frequency.

6. The method of calibrating the IMCS in the buck converter as claimed in claim 1, wherein the step of calibrating the sensing capacitance comprises steps of:
enabling a capacitance calibration signal and disabling an inductance calibration signal and a resistance calibration signal;
providing a capacitance-calibrating frequency;
regulating an output voltage of the buck converter to reach a target voltage;
setting a count value to be equal to a maximum number of bits in the sensing capacitance; and
sequentially tuning all bits of the sensing capacitance.

7. The method of calibrating the IMCS in the buck converter as claimed in claim 3, wherein the step of calibrating the sensing resistance comprises steps of:
enabling the resistance calibration signal and disabling the inductance calibration signal and the capacitance calibration signal;
providing a resistance-calibrating frequency;
setting a count value to be equal to the maximum number of bits in the sensing resistance; and
sequentially tuning all bits of the sensing resistance.

8. The method of calibrating the IMCS in the buck converter as claimed in claim 7, wherein the resistance-calibrating frequency is a resonant frequency determined by at least one weighted bit of the sensing inductance and at least one weighted bit of the sensing capacitance.

9. The method of calibrating the IMCS in the buck converter as claimed in claim 7, wherein an impedance of the IMCS is dominated by an inductive impedance in the inductance-calibrating frequency, the impedance of the IMCS is dominated by a resistive impedance in the resistance-calibrating frequency, and the impedance of the IMCS is dominated by a capacitive impedance in the capacitance-calibrating frequency.

10. An apparatus of calibrating an impedance-matching current sensor (IMCS) in a buck converter, the IMCS having a sensing inductance, a sensing capacitance, and a sensing resistance connected in series, the circuit comprising:
an inductor current sensor configured to sense an output inductor current flowing through an output inductor of the buck converter;
the IMCS configured to sense an output capacitor current flowing through an output capacitor of the buck converter;
a current ripple comparator configured to compare a ripple of the output capacitor current with a ripple of the output inductor current to generate a comparison signal; and
a controller configured to receive the comparison signal and a calibration enable signal; wherein the controller is configured to control the buck converter being operated under an open-loop operation and calibrate the sensing inductance, the sensing capacitance, and the sensing resistance according to the comparison signal and the calibration enable signal.

11. The apparatus of calibrating the IMCS in the buck converter as claimed in claim 10, wherein one of the sensing inductance and the sensing capacitance is first calibrated, the other of the sensing inductance and the sensing capacitance is then calibrated, and the sensing resistance is last calibrated.

12. The apparatus of calibrating the IMCS in the buck converter as claimed in claim 11, further comprising a PWM generator, wherein the controller is configured to control the PWM generator to generate a PWM signal with an adjustable switching frequency including an inductance-calibrating frequency, a capacitance-calibrating frequency, and a resistance-calibrating frequency.

13. The apparatus of calibrating the IMCS in the buck converter as claimed in claim 12, wherein the sensing inductance is calibrated under the inductance-calibrating frequency, the sensing capacitance is calibrated under the capacitance-calibrating frequency, and the sensing resistance is calibrated under the resistance-calibrating frequency.

14. The apparatus of calibrating the IMCS in the buck converter as claimed in claim 13, wherein the resistance-calibrating frequency is a resonant frequency determined by the sensing inductance and the sensing capacitance.

15. The apparatus of calibrating the IMCS in the buck converter as claimed in claim 14, wherein an impedance of the IMCS is dominated by an inductive impedance in the inductance-calibrating frequency, the impedance of the IMCS is dominated by a resistive impedance in the resistance-calibrating frequency, and the impedance of the IMCS is dominated by a capacitive impedance in the capacitance-calibrating frequency.

* * * * *